US010867938B2

(12) United States Patent
Tang et al.

(10) Patent No.: US 10,867,938 B2
(45) Date of Patent: Dec. 15, 2020

(54) PACKAGE STRUCTURE

(71) Applicant: Taiwan Semiconductor Manufacturing Co., Ltd., Hsinchu (TW)

(72) Inventors: Tzu-Chun Tang, Kaohsiung (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 108 days.

(21) Appl. No.: 16/035,716

(22) Filed: Jul. 16, 2018

(65) Prior Publication Data
US 2019/0096829 A1 Mar. 28, 2019

Related U.S. Application Data

(60) Provisional application No. 62/563,033, filed on Sep. 25, 2017.

(51) Int. Cl.
*H01Q 21/00* (2006.01)
*H01L 23/66* (2006.01)
*H01L 23/538* (2006.01)
*H01L 23/00* (2006.01)
*H01L 21/48* (2006.01)
(Continued)

(52) U.S. Cl.
CPC ............ *H01L 23/66* (2013.01); *H01L 21/486* (2013.01); *H01L 21/565* (2013.01); *H01L 21/568* (2013.01); *H01L 21/6835* (2013.01); *H01L 23/5384* (2013.01); *H01L 23/5386* (2013.01); *H01L 23/5389* (2013.01); *H01L 24/19* (2013.01); *H01L 24/20* (2013.01); *H01Q 1/2225* (2013.01); *H01Q 1/2283* (2013.01); *H01Q 1/38* (2013.01); *H01Q 1/40* (2013.01); *H01Q 7/00* (2013.01); *H01Q 21/065* (2013.01); *H01Q 21/08* (2013.01); *H01Q 21/28* (2013.01); *H01L 23/3128* (2013.01); *H01L 2221/68345* (2013.01); *H01L 2221/68359* (2013.01); *H01L 2223/6616* (2013.01); *H01L 2223/6677* (2013.01); *H01L 2224/04105* (2013.01); *H01L 2224/12105* (2013.01); *H01L 2224/16227* (2013.01); *H01L 2224/211* (2013.01); *H01L 2224/214* (2013.01);
(Continued)

(58) Field of Classification Search
CPC .... H01Q 21/00; H01Q 21/065; H01Q 1/2283; H01L 23/66; H01L 21/486; H01L 21/565; H01L 21/568
USPC .......................................................... 343/893
See application file for complete search history.

(56) References Cited

U.S. PATENT DOCUMENTS 9,000,584 B2   4/2015 Lin et al.
9,048,222 B2   6/2015 Hung et al.
(Continued)

*Primary Examiner* — Huedung X Mancuso
(74) *Attorney, Agent, or Firm* — JCIPRNET

(57) ABSTRACT

A package structure includes a sub-package, a conductive structure, and at least one first antenna. The sub-package includes at least one chip. The conductive structure is bonded onto and electrically connected to the sub-package. The at least one first antenna has a vertical polarization and is electrically connected to the at least one chip, wherein the at least one first antenna is partially located in the sub-package, and the at least one first antenna is extended within the sub-package into the conductive structure.

20 Claims, 12 Drawing Sheets

(51) Int. Cl.
   *H01L 21/683* (2006.01)
   *H01L 21/56* (2006.01)
   *H01Q 1/22* (2006.01)
   *H01Q 21/06* (2006.01)
   *H01Q 7/00* (2006.01)
   *H01Q 21/08* (2006.01)
   *H01Q 21/28* (2006.01)
   *H01Q 1/40* (2006.01)
   *H01Q 1/38* (2006.01)
   *H01L 23/31* (2006.01)

(52) U.S. Cl.
   CPC ............... *H01L 2224/32225* (2013.01); *H01L 2224/73267* (2013.01); *H01L 2224/92244* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2006/0214798 A1* | 9/2006 | Wang ................. G06K 19/0723 340/572.7 |
| 2011/0163919 A1* | 7/2011 | Suzuki ................ H01Q 1/2283 343/700 MS |
| 2014/0151880 A1* | 6/2014 | Kao ..................... H01L 24/73 257/738 |
| 2014/0239438 A1* | 8/2014 | Kilger ................... H01L 21/78 257/528 |
| 2015/0194388 A1* | 7/2015 | Pabst .................... H01L 23/552 257/659 |
| 2018/0269139 A1* | 9/2018 | Chiang ............... H01L 21/6835 |
| 2019/0058241 A1* | 2/2019 | So ......................... H01L 24/19 |
| 2019/0333882 A1* | 10/2019 | Kamgaing ............. H01L 24/00 |

* cited by examiner

PACKAGE STRUCTURE

CROSS-REFERENCE TO RELATED APPLICATION

This application claims the priority benefits of U.S. provisional application Ser. No. 62/563,033, filed on Sep. 25, 2017. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
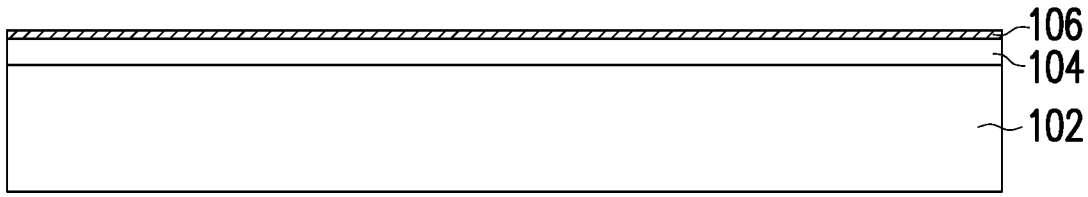
FIG. 1 to FIG. 16 are schematic cross sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 16 are schematic cross sectional views of various stages in a manufacturing method of a package structure according to some exemplary embodiments of the present disclosure. FIG. 17 is a schematic top view illustrating a relative position between antennas and a semiconductor chip depicted in FIG. 16. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 16, one die is shown to represent plural dies of the wafer, and a combination of a first package 10 and a second package 500 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 102 is provided. In some embodiments, the carrier 102 may be a glass carrier or any suitable carrier for the manufacturing method of the first package 10. In some embodiments, the carrier 102 is coated with a debond layer 104. The material of the debond layer 104 may be any material suitable for bonding and debonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature debonding from the carrier 102 by applying laser irradiation, however the disclosure is not limited thereto.

Continued on FIG. 1, in some embodiments, a seed layer 106 is formed over the carrier 102 and on the debond layer 104. For example, the seed layer 106 is formed on the debond layer 104 in a form of a blanket layer made of metal or metal alloy materials to cover the debond layer 104, the disclosure is not limited thereto. In some embodiments, the seed layer 106 are referred as a metal layer, which may be a single layer or a composite layer comprising a plurality of sub-layers formed of different materials. In some embodiments, the seed layer 106 may include titanium, copper, molybdenum, tungsten, titanium nitride, titanium tungsten, combinations thereof, or the like. For example, the seed layer 106 may include a titanium layer and a copper layer over the titanium layer. The seed layer 106 may be formed using, for example, sputtering, physical vapor deposition (PVD), or the like. In some embodiments, the seed layer 106 may be conformally formed on the debond layer 104 by sputtering. As shown in FIG. 1, in some embodiments, the seed layer 106 is in physical contact with the debond layer 104, and the debond layer 104 is located between the carrier 102 and the seed layer 106.

Figure 2:
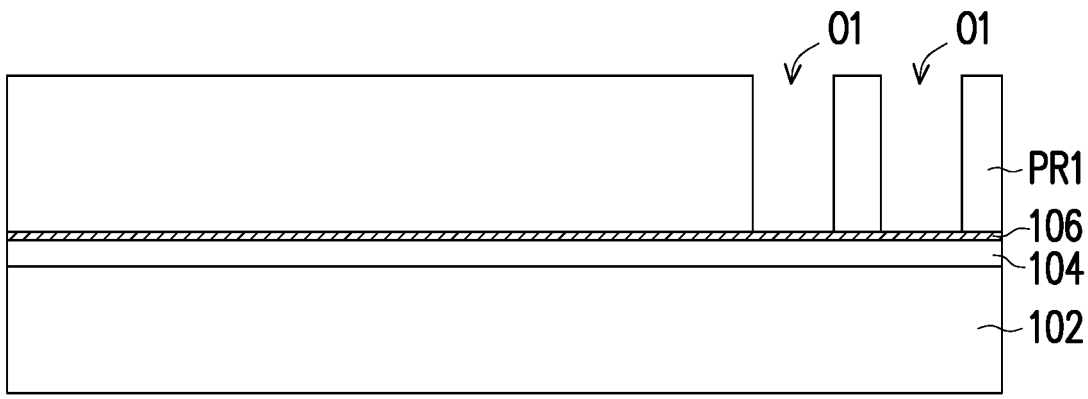

Referring to FIG. 2, in some embodiments, a patterned photoresist layer PR1 is formed on the seed layer 106, where the patterned photoresist layer PR1 includes at least one opening O1. In some embodiments, a plurality of openings O1 are formed in the patterned photoresist layer PR1. In one embodiment, the patterned photoresist layer PR1 may be formed by coating and photolithography processes or the like. The number of the openings O1 may, for example, correspond to the number of later-formed conductive structure(s) (such as a conductive pillar or conductive via). However, the disclosure is not limited thereto. As shown in FIG. 2, portions of the seed layer 106 are exposed by the openings O1 formed in the patterned photoresist layer PR1, respectively. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing).

Figure 3:
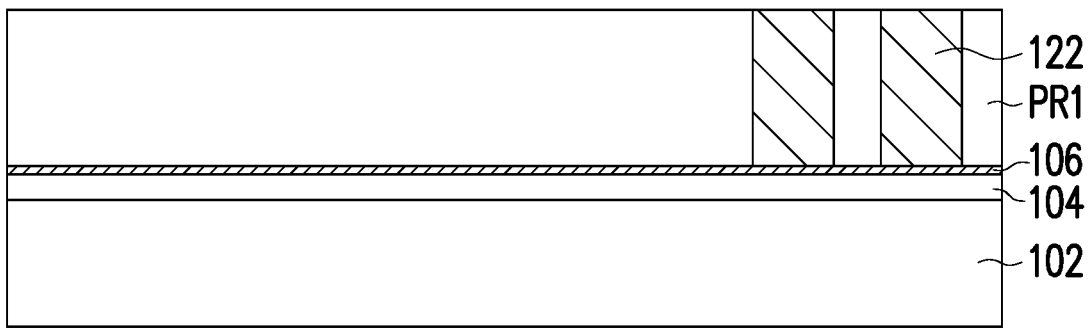

Referring to FIG. 3, in some embodiments, conductive vias 122 are formed in the openings O1, respectively. In certain embodiments, the conductive vias 122 may be through integrated fan-out (info) vias. In some embodiments, the conductive vias 122 are arranged along but not on a cutting line (not shown) between two package structures 10. In some embodiments, the conductive vias 122 are formed by plating process or any other suitable method, which the plating process may include electroplating or electroless plating, or the like. In one embodiment, the conductive vias 122 may be formed by forming a metallic material filling the openings to form the conductive vias 122 by electroplating or deposition. In one embodiment, the material of the conductive vias 122 may include a metal material such as copper or copper alloys, or the like. For simplification, only two conductive vias 122 are presented in FIG. 3 for illustrative purposes, however, it should be noted that more than two conductive vias 122 may be formed; the disclosure is not limited thereto. The number of the conductive vias 122 can be selected based on the demand, and adjusted by changing the number of the openings O1.

Continued on FIG. 3, for example, after the conductive vias 122 are formed, the patterned photoresist layer PR1 is removed. In one embodiment, the patterned photoresist layer PR1 is removed by acceptable ashing process and/or photoresist stripping process, such as using an oxygen plasma or the like. The disclosure is not limited thereto.

Figure 4:
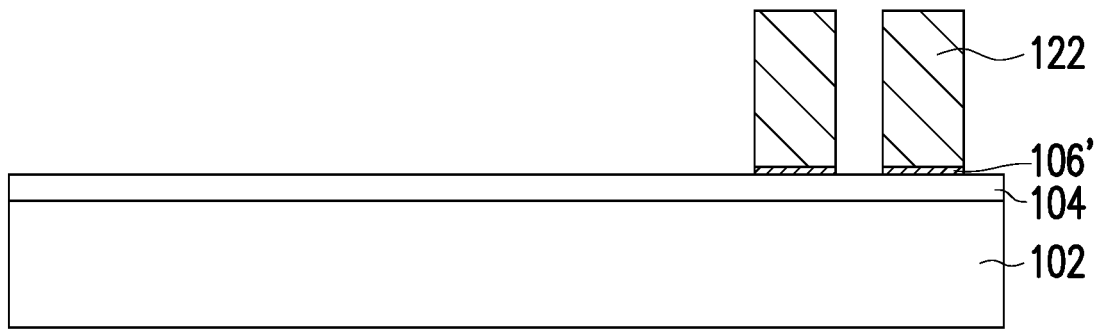

Referring to FIG. 4, in some embodiments, the seed layer 106 is patterned to form a seed layer 106'. In certain embodiments, portions of the seed layer 106 not covered by the conductive vias 122 (depicted in FIG. 3) are removed to form the seed layer 106'. In some embodiments, the seed layer 106 is etched to form the seed layer 106' by using the conductive vias 122 as an etching mask. For example, the etching process may include a dry etching process or a wet etching process. As shown in FIG. 4, the seed layer 106' includes one or more conductive segments which are mechanically and electrically isolated from one another, for example. In certain embodiments, the seed layer 106' are mechanically and electrically connected to a respective one of the conductive vias 122, as shown in FIG. 4. In some embodiments, sidewalls of the seed layer 106' are aligned with sidewalls of a respective one of the conductive vias 122. As shown in FIG. 4, the seed layer 106' is sandwiched between the conductive vias 122 and the debond layer 104.

Figure 5:
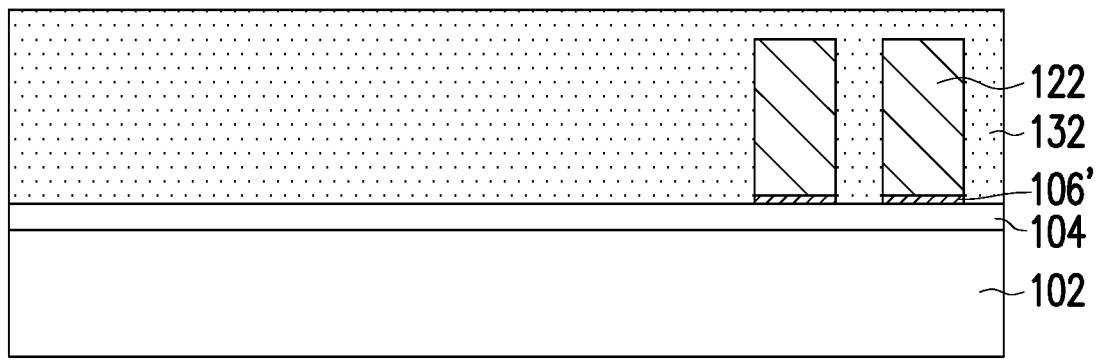

Referring to FIG. 5, in some embodiments, the insulating encapsulation 132 is formed over the carrier 102 and on the debond layer 104. In some embodiments, the insulating encapsulation 132 at least fills the gaps between the conductive vias 122 and between the seed layer 106' and the conductive vias 122, where the seed layer 106' and the conductive vias 122 are encapsulated in the insulating encapsulation 132. In other words, the insulating encapsulation 132, for example, is over-molded over the conductive vias 122, so that a height of the insulating encapsulation 132 is greater than a height of the seed layer 106' and a height of the conductive vias 122. For example, as shown in FIG. 5, the insulating encapsulation 132 covers the debond layer 104, the seed layer 106' and the conductive vias 122, where the debond layer 104, the seed layer 106' and the conductive vias 122 are not accessibly revealed by the insulating encapsulation 132.

In some embodiments, the insulating encapsulation 210 is a molding compound formed by a molding process. In some embodiments, the insulating encapsulation 132, for example, may include polymers (such as epoxy resins, phenolic resins, silicon-containing resins, or other suitable resins), dielectric materials having low permittivity (Dk) and low loss tangent (Df) properties, or other suitable materials. In one embodiment, low permittivity may refer to a Dk value smaller than or substantially equal to 3, and low loss tangent may refer to a Df value smaller than or substantially equal to 0.005. Depending on the frequency range of the high-speed applications, suitable materials of the insulating encapsulation 134 may be selected based on the required electrical properties of the first package 10. In an alternative embodiment, the insulating encapsulation 132 may include an acceptable insulating encapsulation material. In some embodiments, the insulating encapsulation 132 may further include inorganic filler or inorganic compound (e.g. silica, clay, and so on) which can be added therein to optimize coefficient of thermal expansion (CTE) of the insulating encapsulation 132. The disclosure is not limited thereto.

Figure 6:
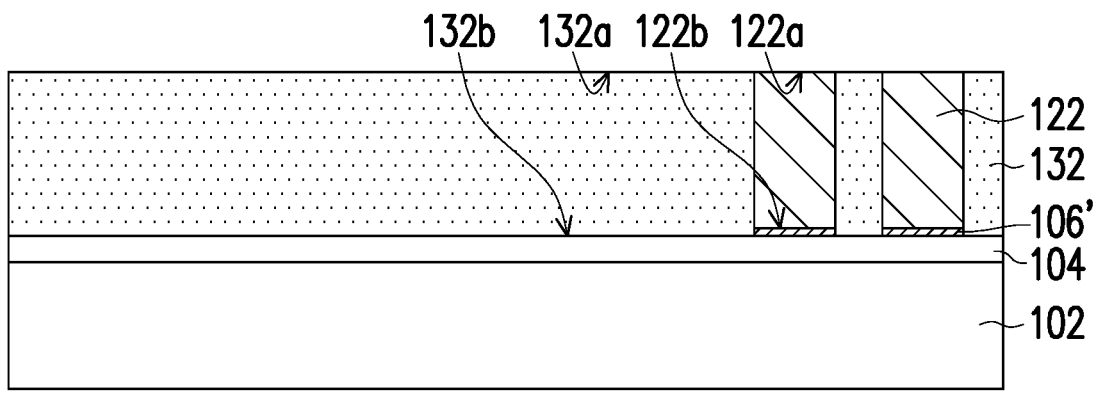

Referring to FIG. 6, in some embodiments, the insulating encapsulation 132 is planarized until top surfaces 122a of the conductive vias 122 are exposed. In some embodiments, sidewalls of the conductive vias 122 are surrounded and covered by the insulating encapsulation 132, and the top surfaces 122a of the conductive vias 122 are exposed by a top surface 132a of the insulating encapsulation 132. For example, the top surfaces 122a of the conductive vias 122 are substantially levelled with the top surface 132a of the insulating encapsulation 132, as shown in FIG. 6. That is, the top surfaces 122a of the conductive vias 122 are substantially coplanar to the top surface 132a of the insulating encapsulation 132.

In certain embodiments, the planarizing process may, for example, performed on the over-molded insulating encapsulation 132 to level the top surface 132a of the insulating encapsulation 132 and the top surfaces 122a of the conductive vias 122. In other words, the top surfaces 122a of the conductive vias 122 is accessibly revealed by the insulating encapsulation 132 by planarizing process. In some embodiments, in the mentioned planarizing process, portions of the conductive vias 122 may be removed, for example. However, the disclosure is not limited thereto.

In some embodiments, the insulating encapsulation 132 may be planarized by mechanical grinding or chemical mechanical polishing (CMP), for example. After the planarizing process, a cleaning step may be optionally performed, for example to clean and remove the residue generated from the planarizing step. However, the disclosure is not limited thereto, and the planarizing step may be performed through any other suitable method.

Figure 7:
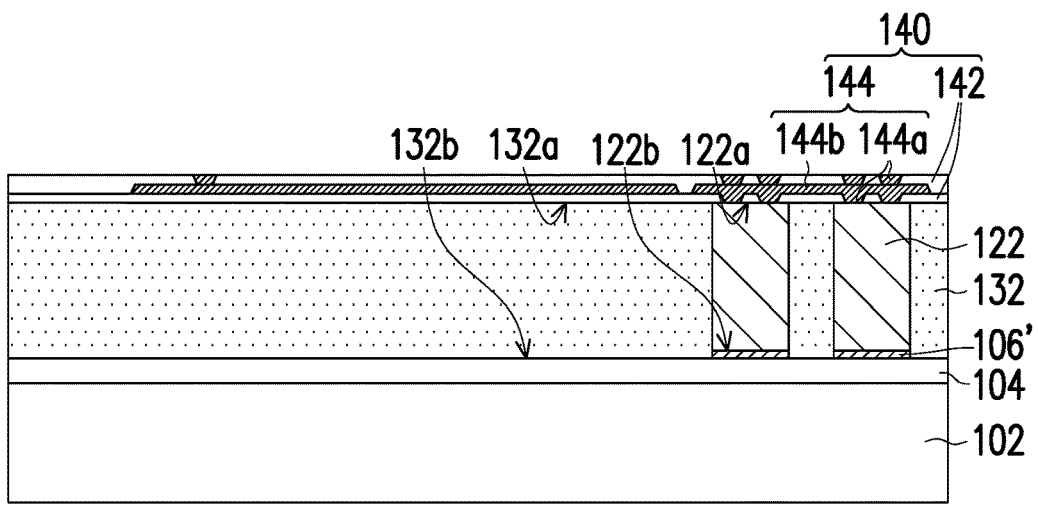

Referring to FIG. 7, in some embodiments, a redistribution layer 140 is formed on the insulating encapsulation 132 and the conductive vias 122. In some embodiments, the redistribution layer 140 is formed on the top surface 132a of the insulating encapsulation 132 and the top surfaces 122a of the conductive vias 122. In some embodiments, the redistribution layer 140 is mechanically and electrically connected to the conductive vias 122, as shown in FIG. 7.

In some embodiments, the formation of the redistribution layer 140 includes sequentially forming one or more dielectric layers 142 and one or more metallization layers 144 in alternation. In certain embodiments, as shown in FIG. 7, the metallization layers 144 are sandwiched between the dielectric layers 142. In certain embodiments, one or more the metallization layers 144 includes vias 144a, one or more the metallization layers 144 includes metal segments 144b, and/or one or more the metallization layers 144 may include vias 144a and metal segments 144b mechanically and electrically connected to the vias 144a. As shown in FIG. 7, for example, each of the conductive vias 122 is mechanically and electrically connected to two vias 144a of the lowest layer of the metallization layers 144 exposed by the lowest layer of the dielectric layers 142; and two vias 144a of the topmost layer of the metallization layers 144 are exposed by the topmost layer of the dielectric layers 142 for electrically connecting later-formed elements. However, in an alternative embodiment, each of the conductive vias 122 may be mechanically and electrically connected to more than two vias of the lowest layer of the metallization layers 144 exposed by the lowest layer of the dielectric layers 142, and/or be mechanically and electrically connected to more than two vias of the topmost layer of the metallization layers 144 exposed by the topmost layer of the dielectric layers 142, the disclosure is not limited thereto.

In some embodiments, the material of the dielectric layers 142 includes polyimide, epoxy resin, acrylic resin, phenol resin, benzocyclobutene (BCB), polybenzoxazole (PBO), or any other suitable polymer-based dielectric material, and the dielectric layers 142 may be formed by deposition. In some embodiments, the material of the metallization layers 144 includes aluminum, titanium, copper, nickel, tungsten, and/or alloys thereof, and the metallization layers 144 may be formed by electroplating or deposition. In some embodiments, the vias 144a and a respective one of the metal segments 144b may be formed in the same step, however the disclose is not limited thereto. In an alternative embodiment, the vias 144a and a respective one of the metal segments 144b may be formed in the different steps. In some embodiments, the materials of the vias 144a and the metal segments 144b may be the same or different, the disclosure is not limited thereto. The numbers of the dielectric layers 142 and the metallization layers 144 included in the redistribution layer 140 is not limited according to the disclosure.

Figure 8:
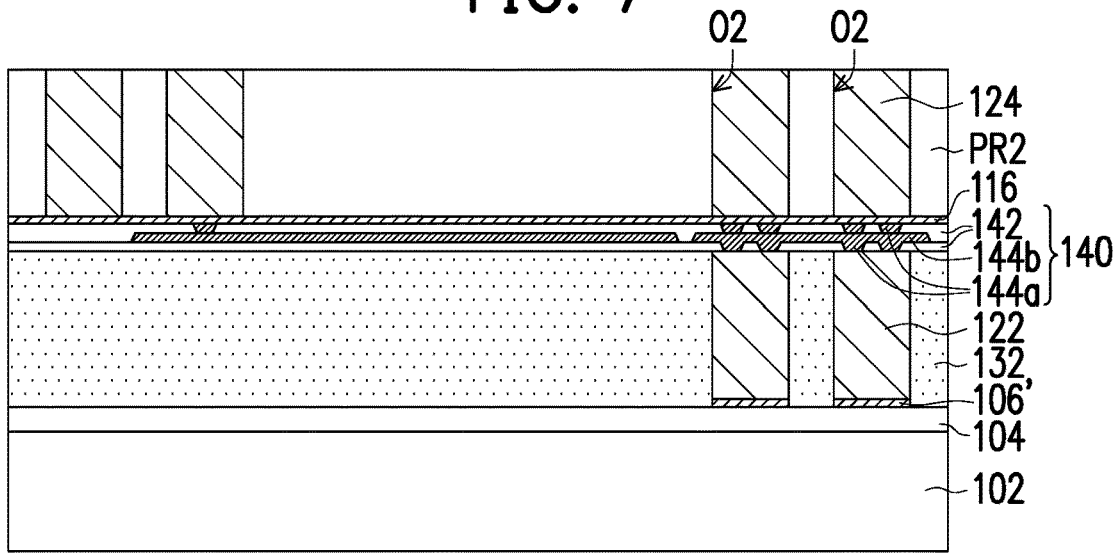

Referring to FIG. 8, in some embodiments, a seed layer 116, a patterned photoresist layer PR2, and conductive vias 124 are sequentially formed on the redistribution layer 140. The formation methods and materials of the seed layer 116, the patterned photoresist layer PR2, and the conductive vias 124 are similar to the processes and materials for forming the seed layer 106 as described in FIG. 1, the patterned photoresist layer PR1 as described in FIG. 2, and the conductive vias 122 as described in FIG. 3, respectively; and thus, may not be repeated herein. As shown in FIG. 8, the seed layer 116 is formed on the redistribution layer 140 in a form of a blanket layer made of metal or metal alloy materials to cover the redistribution layer 140, and the patterned photoresist layer PR2 is formed on top of the seed layer 116, where portions of the seed layer 116 are exposed by a plurality of opening O2 formed in the patterned photoresist layer PR2. Then, after the patterned photoresist layer PR2 is formed, the conductive vias 124 are formed in the openings O2, respectively. After the conductive vias 124 are formed, the patterned photoresist layer PR2 is removed. In one embodiment, the patterned photoresist layer PR2 is removed by acceptable ashing process and/or photoresist stripping process, such as using an oxygen plasma or the like. The disclosure is not limited thereto. For simplification, only four conductive vias 124 are presented in FIG. 8 for illustrative purposes, however, the disclosure is not limited thereto. The number of the conductive vias 124 can be selected based on the demand, and adjusted by changing the number of the openings O2. In some embodiments, the materials of the conductive vias 122 and the conductive vias 124 may be the same or different, the disclosure is not limited thereto. As shown in FIG. 8, each of the conductive vias 124 is overlapped with and electrically connected to a respectively one of the conductive vias 122 along a direction parallel to a stacking direction of the insulating encapsulation 132 and the redistribution layer 140, and the seed layer 116. In other orders, each of the conductive vias 122 is aligned with and directly above one respective conductive vias 124 along a stacking direction of the redistribution layer 140 and the redistribution layer 160.

Figure 9:
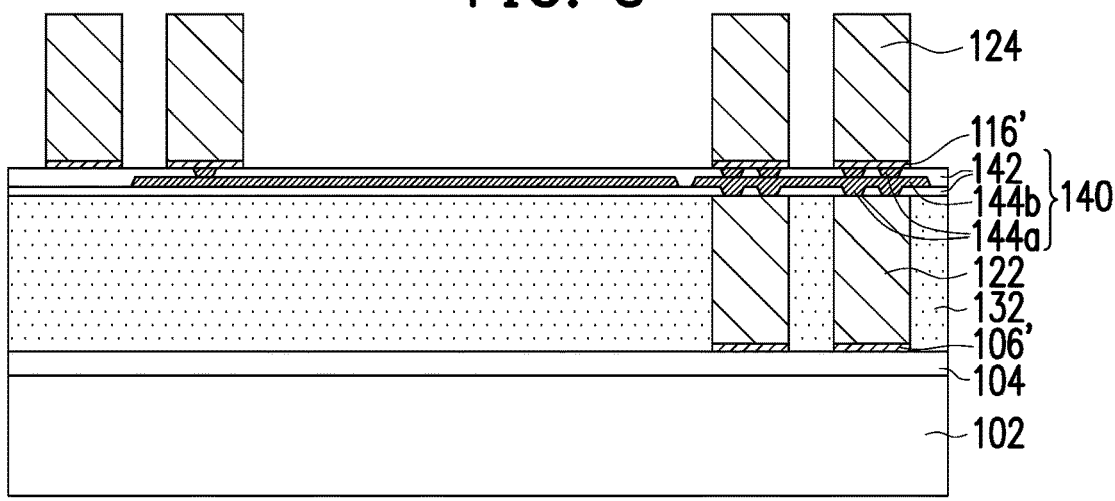

Referring to FIG. 9, in some embodiments, the seed layer 116 is patterned to form a seed layer 116'. The formation methods and materials of the seed layer 116' are similar to the processes and materials for forming the seed layer 106' as described in FIG. 4, and thus may not be repeated herein. As shown in FIG. 9, the seed layer 116' includes one or more conductive segments which are mechanically and electrically isolated from one another, for example. In certain embodiments, the seed layer 116' are mechanically and electrically connected to a respective one of the conductive vias 124, as shown in FIG. 9. In some embodiments, sidewalls of the seed layer 116' are aligned with sidewalls of a respective one of the conductive vias 124. In certain embodiments, the seed layer 116' is sandwiched between the conductive vias 124 and the redistribution layer 140. In some embodiments, the conductive vias 124 are electrically connected to the conductive vias 122 through the redistribution layer 140 and the seed layer 116', where the seed layer 116' is mechanically and electrically connect to the conductive vias 124 and the redistribution layer 140 (e.g. the vias 144a of the topmost layer of the metallization layers 144 are exposed by the topmost layer of the dielectric layers 142). As shown in FIG. 9, some of the conductive vias 124 are electrically connected to the conductive vias 122 through the seed layer 116' and the redistribution layer 140.

Figure 10:
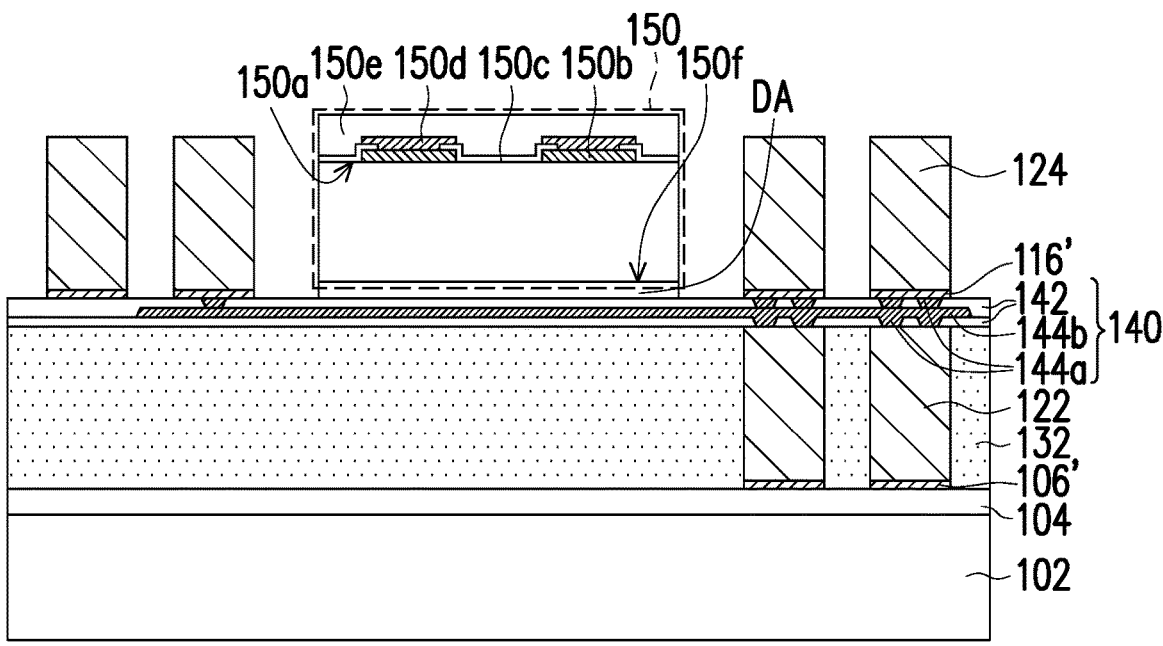

Referring in FIG. 10, in some embodiments, at least one semiconductor die 150 is provided. In some embodiments, the semiconductor die 150 is disposed on the redistribution layer 140 through a die attach film DA. In certain embodiments, the die attach film DA is first disposed on a backside 150f of the semiconductor die 150, then the semiconductor die 150 is attached to the redistribution layer 140 by placing the die attach film DA between the semiconductor die 150 and the redistribution layer 140. With the die attach film DA, a better adhesion between the semiconductor die 150 and the redistribution layer 140 is ensured. For example, in FIG. 10, the backside 150f of the semiconductor die 150 is stably adhered to the redistribution layer 140 through the die attach film DA provided between the semiconductor die 150 and the redistribution layer 140. In some embodiments, the redistribution layer 140 is referred as a back-side redistribution layer of the semiconductor die 150.

In some embodiments, the semiconductor die 150 includes an active surface 150a, a plurality of pads 150b distributed on the active surface 150a, a passivation layer 150c covering the active surface 150a and a portion of the pads 150b, a plurality of conductive pillars 150d connected to the portion of the pads 150b, a protection layer 150e covering the pads 150b and the conductive pillars 150d, and the backside 150f opposite to the active surface 150a. As shown in FIG. 10, for example, the pads 150b are partially exposed by the passivation layer 150c, the conductive pillars 150d are disposed on and electrically connected to the pads 150b, and the protection layer 150e covers the passivation layer 150c and the conductive pillars 150d, as shown in FIG. 10. In some embodiments, the pads 150b may be aluminum pads or other suitable metal pads. In some embodiments, the conductive pillars 150d are copper pillars, copper alloy pillar or other suitable metal pillars, for example. In some embodiments, the passivation layer 150c and/or the protection layer 150e may be a polybenzoxazole (PBO) layer, a polyimide (PI) layer or other suitable polymers. In some alternative embodiments, the passivation layer 150c and/or the protection layer 150e may be made of inorganic materials, such as silicon oxide, silicon nitride, silicon oxynitride, or any suitable dielectric material. In certain embodiments, the materials of the passivation layer 150c and the protection layer 150e may be the same or different, the disclosure is not limited thereto. In an alternative embodiment, the semiconductor die 150 may include the active surface 150a, the pads 150b distributed on the active surface 150a, the passivation layer 150c covering the active surface 150a and a portion of the pad 150b, and the backside surface 150f opposite to the active surface 150a.

It is noted that, the semiconductor die 150 described herein may be referred as a chip or an integrated circuit (IC). In an alternative embodiment, the semiconductor die 150 described herein may be semiconductor devices. In certain embodiments, the semiconductor die 150 may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor die 150 may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

Figure 11:
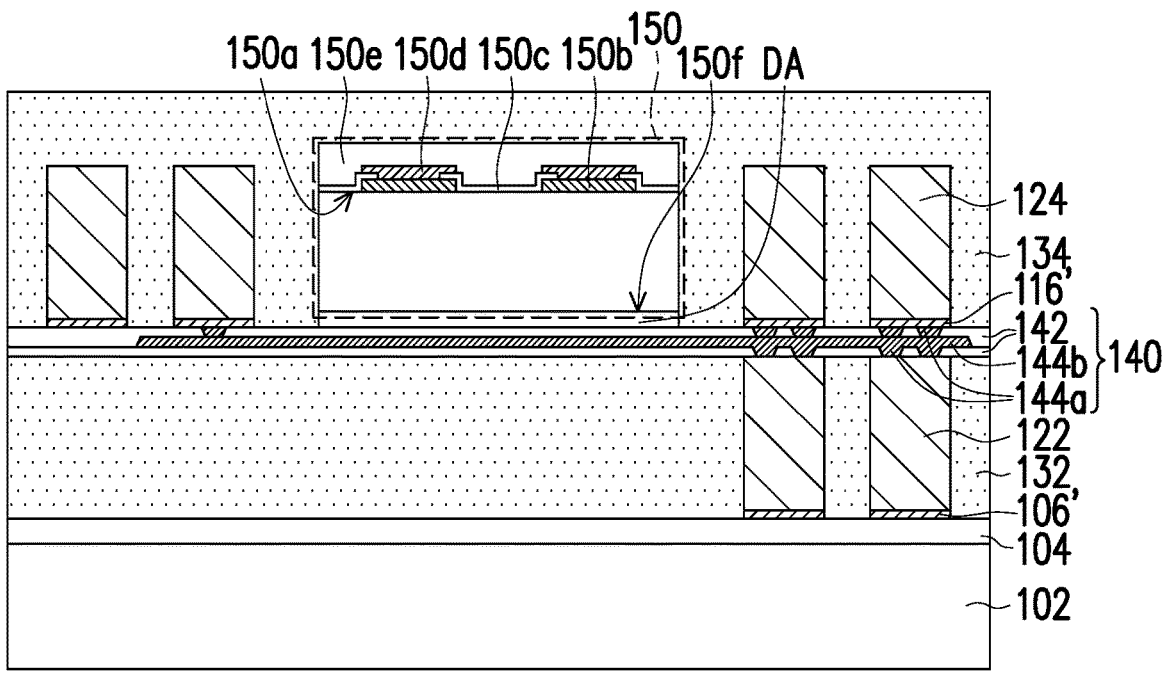

Referring to FIG. 11, in some embodiments, the conductive vias 124 and the semiconductor die 150 are encapsulated in an insulating encapsulation 134. The formation methods and materials of the insulating encapsulation 134 are similar to the processes and materials for forming the insulating encapsulation 132 as described in FIG. 5, and thus may not be repeated herein. In some embodiments, the insulating encapsulation 134 at least fills the gaps between the conductive vias 124 and between the conductive vias 124 and the semiconductor die 150, and covers sidewalls and top surfaces of the conductive vias 124 and the semiconductor die 150 and the topmost layer of the dielectric layers 142 exposed by the conductive vias 124 and the semiconductor die 150. In some embodiments, a material of the insulating encapsulation 134 may be the same as the material of the insulating encapsulation 132, however the disclosure is not limited thereto. In an alternative embodiment, the material of the insulating encapsulation 134 may be different from the material of the insulating encapsulation 132.

Figure 12:
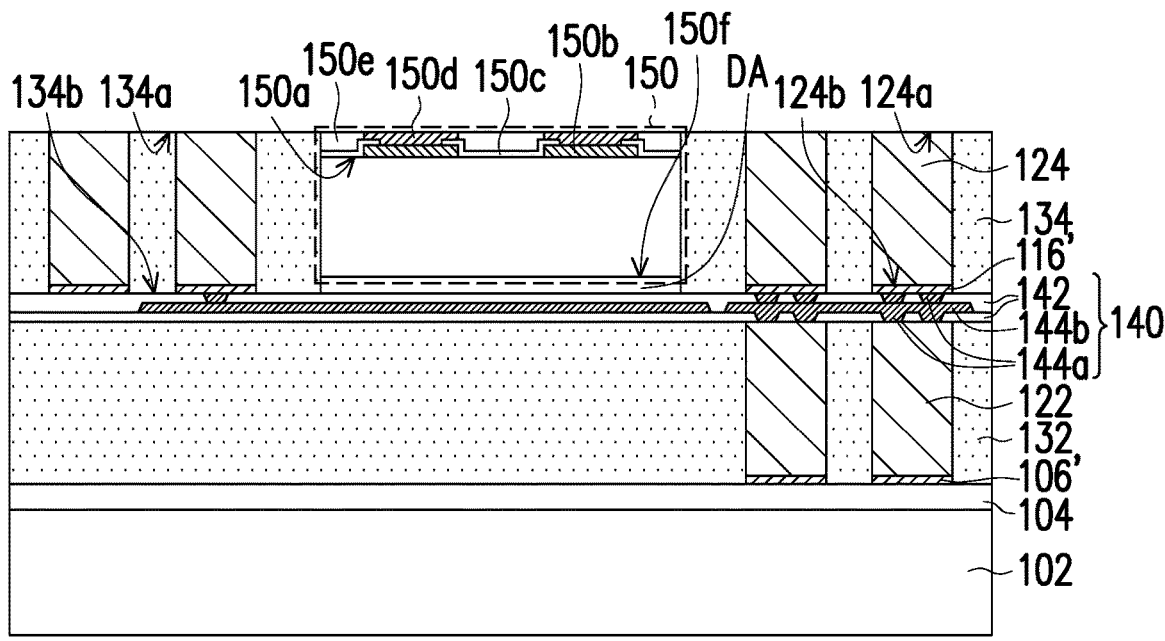

Referring to FIG. 12, in some embodiments, the insulating encapsulation 134 is planarized until the conductive vias 124 and the semiconductor die 150 are exposed. In certain embodiments, as shown in FIG. 12, after the planarization, top surfaces 124a of the conductive vias 124 and top surfaces of the conductive pillars 150d and the protection layer 150e of the semiconductor die 150 are exposed by a top surface 134a of the insulating encapsulation 134. That is, for example, the top surfaces of the conductive pillars 150d and the protection layer 150e of the semiconductor die 150 and the top surfaces 124a of the conductive vias 124 become substantially leveled with the top surface 134a of the insulating encapsulation 134. In other words, the top surfaces of the conductive pillars 150d and the protection layer 150e of the semiconductor die 150, the top surfaces 124a of the conductive vias 124, and the top surface 134a of the insulating encapsulation 134 are substantially coplanar to each other. In some embodiments, the insulating encapsulation 134 is planarized through a grinding process or a CMP process. After the grinding process, a cleaning step may be optionally performed, for example to clean and remove the residue generated from the grinding step. However, the disclosure is not limited thereto, and the planarizing step may be performed through any other suitable method.

In some embodiments, during the planarizing process of the insulating encapsulation 134, the conductive vias 124 and the protection layer 150e of the semiconductor die 150 may also be planarized. In certain embodiments, the planarizing process may be, for example, performed on the over-molded insulating encapsulation 134 to level the top surface 134a of the insulating encapsulation 134, the top surfaces 124a of the conductive vias 124, and the top surfaces of the conductive pillars 150d and the protection layer 150e of the semiconductor die 150.

Figure 13:
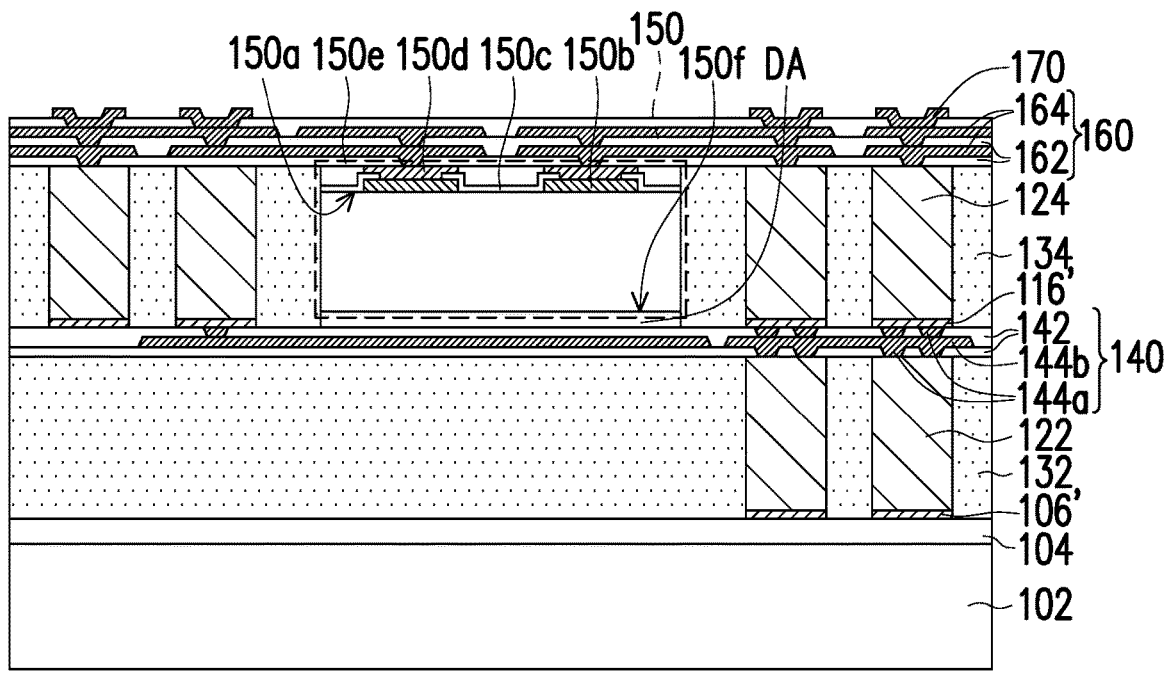

Referring to FIG. 13, in some embodiments, a redistribution layer 160 is formed over the carrier 102. In certain embodiments, the redistribution layer 160 is formed on the conductive vias 124, the semiconductor die 150 and the insulating encapsulation 134. In some embodiments, the redistribution layer 160 is mechanically and electrically connected to the semiconductor die 150 and the conductive vias 124, as shown in FIG. 13. In some embodiments, the redistribution layer 160 is electrically connected to the redistribution layer 140 through the conductive vias 124 and the seed layer 116'. In some embodiments, the redistribution layer 160 is electrically connected to the conductive vias 122 through the conductive vias 124, the seed layer 116', and the redistribution layer 140. In some embodiments, the redistribution layer 160 is electrically connected to the semiconductor die 150 through the conductive pillars 150d.

In some embodiments, the redistribution layer 160 includes one or more dielectric layers 162 and one or more metallization layers 164 arranged in alternation. In some embodiments, the metallization layer 164 is sandwiched between the dielectric layers 162, but the top surface of the metallization layer 164 is exposed by the topmost layer of the dielectric layers 162 and the lowest layer of the metallization layers 164 is exposed by the lowest layer of the dielectric layers 162 to connect the conductive vias 124 and the conductive pillars 150d. In some embodiments, the material of the metallization layers 164 includes aluminum, titanium, copper, nickel, tungsten, and/or alloys thereof, and the metallization layers 164 may be formed by electroplating or deposition. In some embodiments, the material of the dielectric layers 162 includes polyimide, epoxy resin, acrylic resin, phenol resin, benzocyclobutene (BCB), polybenzoxazole (PBO), or any other suitable polymer-based dielectric material. The numbers of the dielectric layers 162 and the metallization layers 164 included in the redistribution layer 160 is not limited according to the disclosure. In addition, the materials of the dielectric layers 142 and the dielectric layers 162 may be the same or different; and/or the materials of the metallization layers 164 and the metallization layers 164 may be the same or different, the disclosure is not limited thereto. As shown in FIG. 13, the semiconductor die 150 and the conductive vias 124 are disposed between the redistribution layer 140 and the second redistribution layer 160, where the conductive vias 124 surrounds the positioning location of semiconductor die 150.

Continued on FIG. 13, in some embodiments, a plurality of under-ball metallurgy (UBM) patterns 170 may be formed on the top surface of the topmost layer of the metallization layers 164 exposed by the topmost layer of the dielectric layers 162 for electrically connecting with conductive elements (e.g. conductive structure, such as conductive balls or other additional semiconductor element (e.g., passive components or active components)). In some embodiments, the materials of the UBM patterns 170 may include copper, nickel, titanium, tungsten, or alloys thereof or the like, and may be formed by an electroplating process, for example. The number of the UBM patterns 170 is not limited in this disclosure and, correspond to the number of portions of the top surface of the topmost layer of the metallization layers 164 exposed by the topmost layer of the dielectric layers 162.

Figure 14:
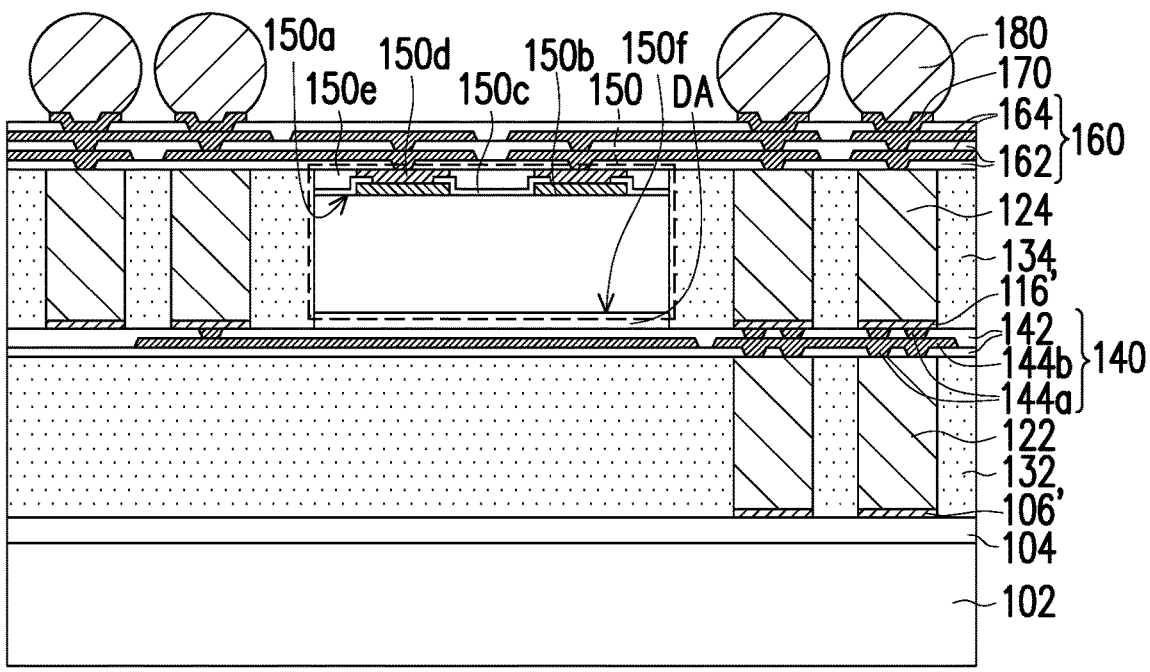

Referring to FIG. 14, in some embodiments, after the redistribution layer 160 is formed, a plurality of conductive elements 180 are formed on the redistribution layer 160, and are electrically connected to the redistribution layer 160 through the UBM patterns 170. In some embodiments, the redistribution layer 160 is located between the insulating encapsulation 134 and the conductive elements 180, between the semiconductor die 150 and the conductive elements 180, and between the conductive vias 124 and the conductive elements 180. As shown in FIG. 14, the conductive elements 180 are mechanically and electrically connected to the UBM patterns 170. In some embodiments, the conductive elements 180 may be disposed on the UBM patterns 170 by ball placement process or reflow process. In some embodiments, the conductive elements 180 are, for example, solder balls or ball grid array (BGA) balls.

In some embodiments, the conductive elements 180 are electrically connected to the redistribution layer 160 through the UBM patterns 170. In some embodiments, some of the conductive elements 180 are electrically connected to the semiconductor die 150 through the UBM patterns 170, the distribution layer 160, and the conductive pillars 150d. In some embodiments, the conductive elements 180 are electrically connected to some of the conductive vias 124 through the UBM patterns 170 and the redistribution layer 160. In some embodiments, some of the conductive elements 180 are electrically connected to the redistribution layer 140 through the UBM patterns 170, the distribution layer 160, and some of the conductive vias 124. In some embodiments, the conductive elements 180 are electrically connected to some of the conductive vias 122 through the UBM patterns 170, the redistribution layer 160, some of the conductive vias 124, and the redistribution layer 140.

Figure 15:
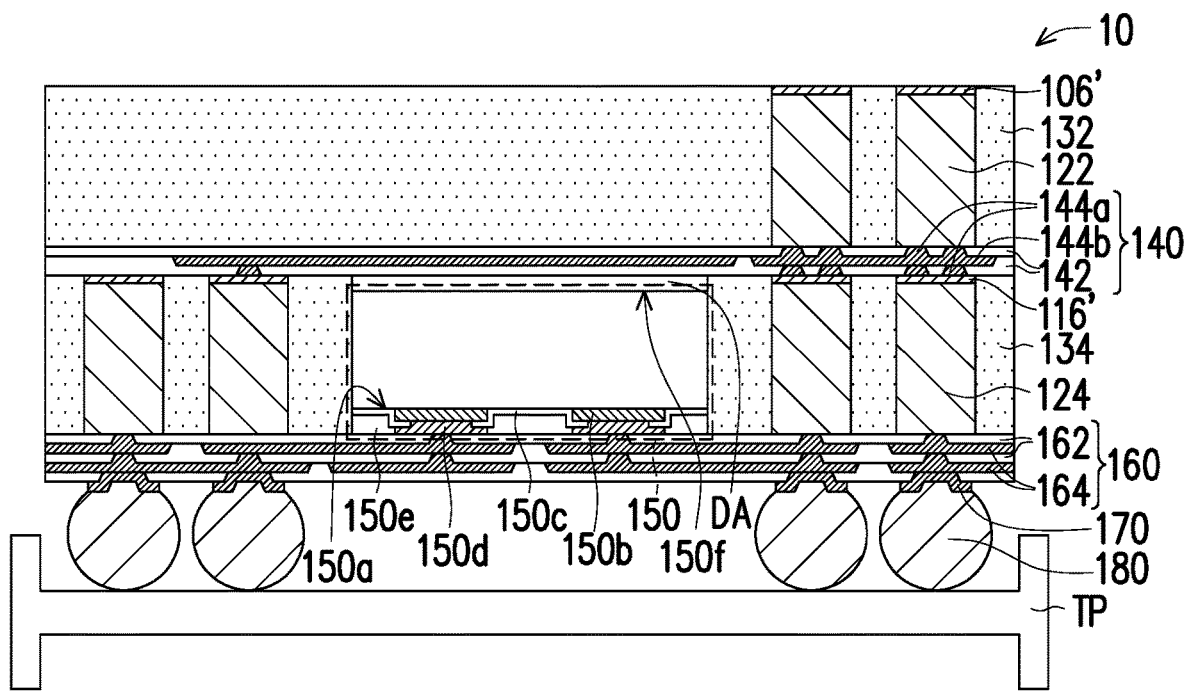

Referring to FIG. 15, in some embodiments, the whole first package 10 along with the carrier 102 is flipped (turned upside down) and then the carrier 102 is debonded from the insulating encapsulation 132 and the seed layer 106'. In some embodiments, the insulating encapsulation 132 and the seed layer 106' are easily separated from the carrier 102 due to the debond layer 104. In some embodiments, the carrier 102 is detached from the insulating encapsulation 132 and the seed layer 106' through a debonding process, the carrier 102 and the debond layer 104 are removed, and the insulating encapsulation 132 and the seed layer 106' are exposed. As shown in FIG. 15, the bottom surface 132b of the insulating encapsulation 132 and a surface of the seed layer 106' are exposed, where the bottom surface 132b of the insulating encapsulation 132 and the surface of the seed layer 106' are substantially levelled with and coplanar to each other.

In one embodiment, the debonding process is a laser debonding process. During the debonding step, a holding device TP is adopted to secure the first package 10 before debonding the carrier 102 and the debond layer 104, where the conductive elements 180 are held by the holding device TP. As shown in FIG. 15, for example, the holding device TP may be an adhesive tape, a carrier film or a suction pad.

Continued on FIG. 15, in some embodiments, the conductive elements 180 are released from the holding device TP to form the first package 10. In some embodiments, prior to releasing the conductive elements 180 from the holding device TP, a dicing process is performed to cut the wafer having a plurality of the first packages 10 into individual and separated first packages 10. In one embodiment, the dicing process is a wafer dicing process including mechanical blade sawing or laser cutting.

Figure 16:
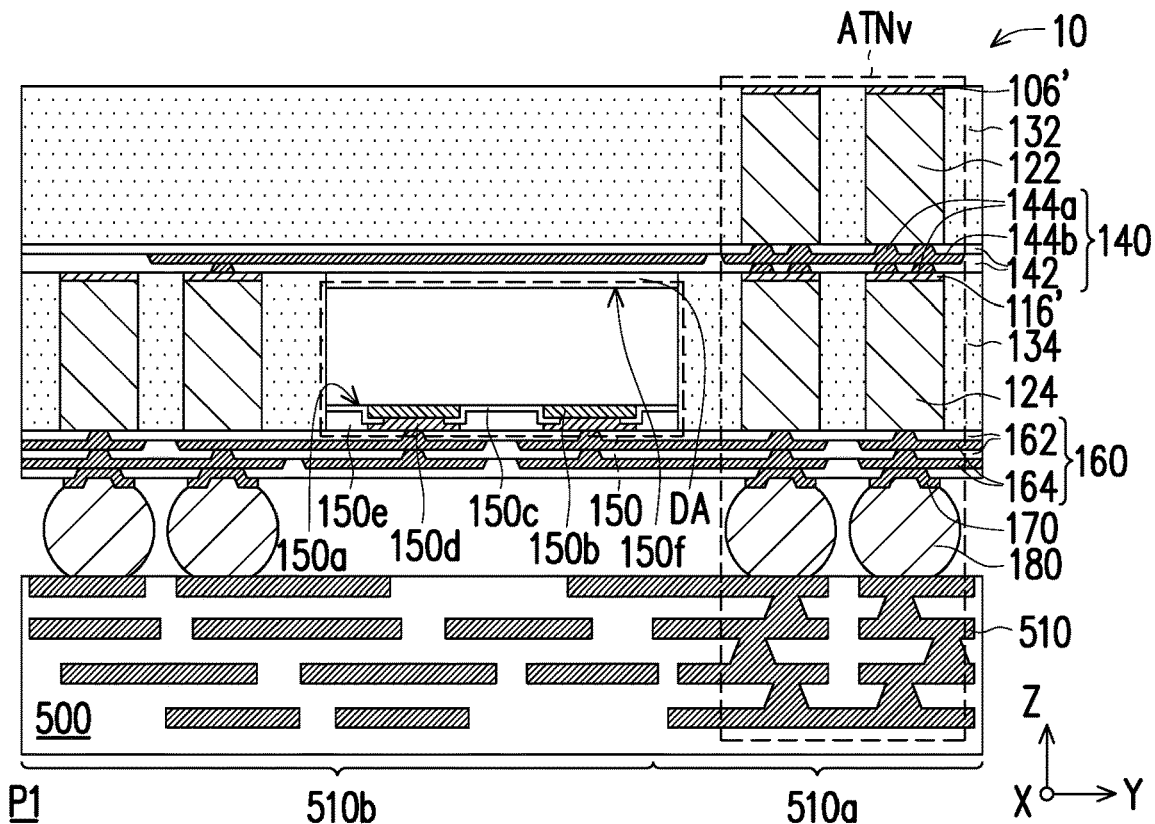
Figure 17:
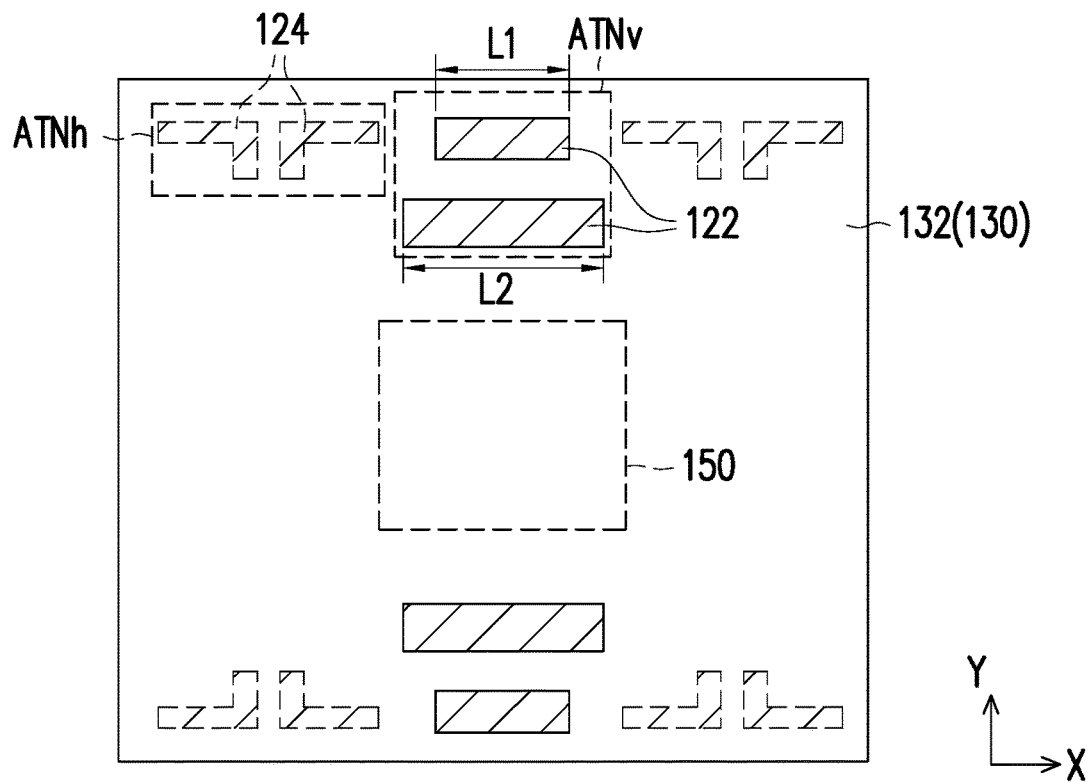
FIG. 17 is a schematic top view illustrating a relative position between antennas and a semiconductor chip depicted in FIG. 16.

Referring to FIG. 16, in some embodiments, the first package 10 is mounted onto a second package 500. In some embodiments, the second package 500 is a circuit board having metal segments 510, where the metal segments 510 includes a first portion 510a and a second portion 510b, where the first portion 510a is electrically isolated from the second portion 510b, and the first portion 510a is configured for antenna application and the second portion 510b is configured for re-routing function. As shown in FIG. 16, the first package 10 is electrically connected to the second package 500 through the conductive elements 180 and the metal segments 510. In some embodiments, the first package 10 is mounted onto the second package 500 by directly connecting the conductive elements 180 and the metal segments 510. For example, the first package 10 may be bonded to the second package 500 through surface mount technology, however the disclosure is not limited thereto. Up to here, the manufacture of the package structure P1 is completed.

Referring to FIG. 16 and FIG. 17 (a top view of the package structure P1 depicted in FIG. 16 only showing the insulating encapsulation 132, the semiconductor die 150, the conductive vias 122, and the conductive vias 124), in some embodiments, the package structure P1 at least includes the first package 10 and the second package 500 electrically connected to each other, where the package structure P1 further includes at least one antenna element ATNv extending from the first package 10 to the second package 500 and electrically connected to the first package 10, and a portion of the antenna element ATNv is located in the first package 10. In some embodiments, the first package 10 includes the conductive vias 122, the conductive vias 124, the insulating encapsulation 132, the insulating encapsulation 134, the redistribution layer 140, the semiconductor die 150, the redistribution layer 160, the UBM patterns 170, the conductive elements 180. In one embodiment, the first package 10 further includes the seed layer 106' mechanically and electrically connected to the conductive vias 122 and the seed layer 116' mechanically and electrically connected to the redistribution layer 140 and the conductive vias 124, however the disclosure is not limited thereto. For example, the second package 500 may include a printed circuit board (PCB).

In some embodiments, as shown in FIG. 16, the semiconductor die 150 and the conductive vias 124 are disposed on the redistribution layer 160 and encapsulated in the insulating encapsulation 134, where the conductive vias 124 are arranged aside of the semiconductor die 150. In some embodiments, the redistribution layer 140 is located on and electrically connected to the semiconductor die 150 and the conductive vias 124, where the insulating encapsulation 134, the semiconductor die 150 and the conductive vias 124 are sandwiched between the redistribution layer 140 and the redistribution layer 160. In certain embodiments, the conductive vias 122 are disposed on and electrically connected to the redistribution layer 140 (e.g. the vias 144a of a topmost layer of the metallization layers 144 of the redistribution layer 140 exposed by a topmost layer of the dielectric layers 142 of the redistribution layer 140 depicted in FIG. 16), and are encapsulated in the insulating encapsulation 132. As shown in FIG. 16, the redistribution layer 140 is located between the insulating encapsulation 132 and the insulating encapsulation 134 and between the conductive vias 122 and the conductive vias 124. In some embodiments, some of the conductive vias 124 are electrically connected to the conductive vias 122 through the seed layer 116' and the redistribution layer 140. As shown in FIG. 16, each of the conductive vias 124 is overlapped with and electrically connected to a respectively one of the conductive vias 122 along a direction parallel to a stacking direction of the redistribution layer 160, the insulating encapsulation 134/the semiconductor die 150, the redistribution layer 140, and the insulating encapsulation 132.

In some embodiments, the conductive elements 180 are located on the redistribution layer 160, where the redistribution layer 160 is located between the insulating encapsulation 134 and the conductive elements 180, between the conductive visa 124 and the conductive elements 180, and the semiconductor die 150 and the conductive elements 180. As shown in FIG. 16, the first package 10 and the second package 500 are electrically connected by directly contacting the conductive elements 180 and the metal segments 510. Due to such configuration, the conductive vias 122, some of the conductive vias 124 electrically connected to the conductive vias 122 through the redistribution layer 140, a portion of the redistribution layer 160 electrically connected to the conductive vias 124, some of the conductive elements 180 electrically connected to the conductive vias 124 through the redistribution layer 160, and the first portion 510a of the metal segments 510 electrically connected to the above conductive elements 180 together constitute the antenna element ATNv, where a part of the redistribution layer 140 or a part of the redistribution layer 160 serves as a feed line of the antenna element ATNv, and the other one is electrically grounded or floating. For example, as shown in FIG. 16 and FIG. 17, the package structure P1 may include one or more antenna elements ATNv. The antenna elements ATNv are referred as an end-fire radiation antenna of vertical polarization (e.g. polarizing in a stacking direction of the redistribution layer 140, the semiconductor die 150 and the redistribution layer 160, for example a direction Z). Due to the second package 500 (e.g. the first portion 510a) is a part of the antenna elements ATNv in the disclosure, a thickness of the first package 10 is reduced. In some embodiments, due to the second portion 510b of the metal segments 510, the second package 500 provides re-routing function for the first package 10.

Referring to FIG. 16 and FIG. 17, in some embodiments, from the top view of the package structure P1, along a direction X, one of two conductive vias 122 used to constitute one antenna element ATNv has a length L1 and the other one has a length L2, where the conductive via 122 having the length L2 is located between the conductive via 122 having the length L1 and the semiconductor die 150, and the length L2 is greater than the length L1. In certain embodiments, the conductive via 122 having the length L2 is electrically grounded, and is referred as a ground plate/line of the antenna element ATNv. In some embodiments, the direction X is different from the direction Z, and the direction X and the direction Z are perpendicular to each other and are perpendicular to a direction Y.

In an alternative embodiment, as shown in FIG. 17, the package structure P1 further includes one or more antenna elements ATNh, and each of the antenna elements ATNh is constituted by two of the conductive vias 124 and located aside of the semiconductor die 150. In one embodiment, for the two the conductive vias 124 in each antenna element ATNh, one conductive via 124 is electrically connected to a part of the redistribution layer 140 or a part of the redistribution layer 160 (one of which serves as a feed line of the antenna element ATNh); and the other conductive via 124, which is electrically connected to the other one of a part of the redistribution layer 140 or a part of the redistribution layer 160 and is electrically grounded, serves as a ground plate/line of the antenna element ATNh. For example, as shown in FIG. 17, the antenna elements ATNh are referred as end-fire radiation antennas of horizontal polarization (e.g. polarizing in the direction X).

In certain embodiments, the antenna elements ATNv and the antenna elements ATNh are alternately arranged into one or more line and surround the semiconductor die 150. However, the arrangement and numbers of the antenna elements ATNv and the antenna elements ATNh may be adjusted by the demand, the disclosure is not limited to what is illustrated in FIG. 17. Owing to the configuration of the antenna elements ATNv (e.g. the end-fire radiation antenna of vertical polarization) and the antenna elements ATNh (e.g. the end-fire radiation antenna of horizontal polarization), a coverage range of the electromagnetic waves in the package structure P1 is increased, and thus the efficiency of the antenna application of the package structure P1 is enhanced.

Figure 18:
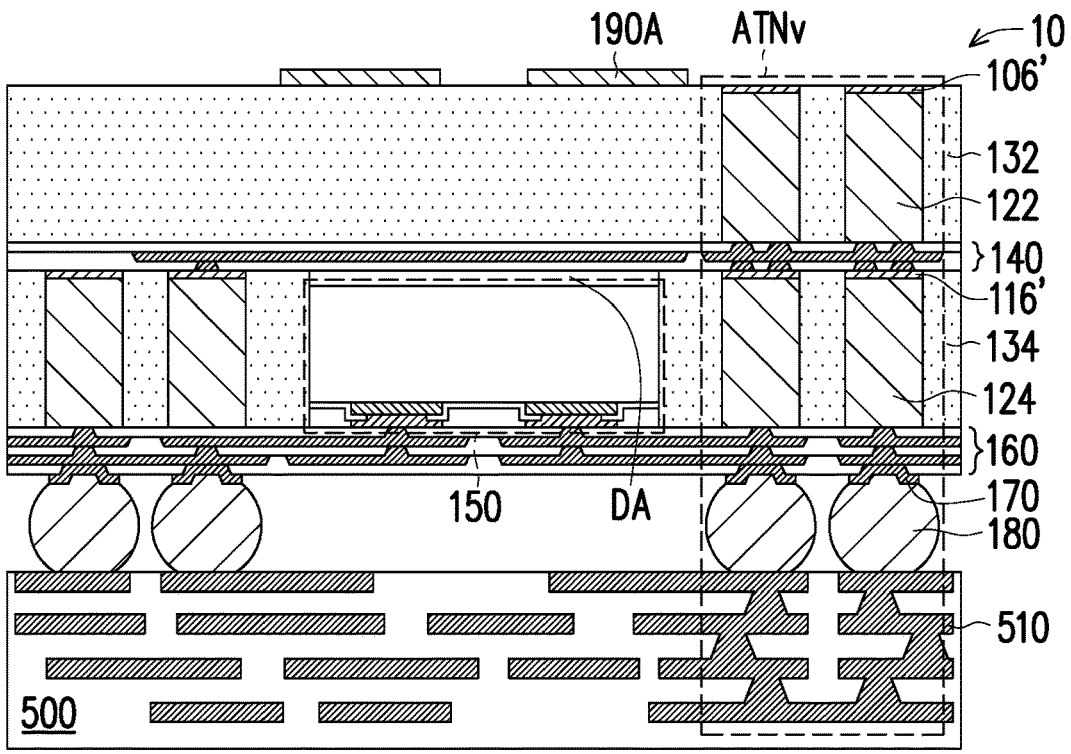
FIG. 18 is a schematic cross sectional view of a package structure according to some exemplary embodiments of the present disclosure.

FIG. 18 is a schematic cross sectional view of a package structure according to some exemplary embodiments of the present disclosure. Referring to FIG. 16 and FIG. 18 together, the package structure P1 depicted in FIG. 16 and the package structure P2 depicted in FIG. 18 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 16 and FIG. 18 together, the difference is that, for the package structure P2 depicted in FIG. 18, the package structure P2 further includes an additional element, e.g. antenna elements 190A. In some embodiments, the antenna elements 190A are formed on the insulating encapsulation 132, and not in physical contact with the conductive vias 122. As shown in FIG. 18, in some embodiments, the location of the antenna elements 190A correspondingly overlap with the locations of the redistribution layer 140. As shown in FIG. 18, the antenna elements 190A are electrically coupled with the metallization layer 144 of the redistribution layer 140, where the metallization layer 144 overlapped with the antenna elements 190A serves as a ground plate and a feed-line for the antenna elements 190A. In other words, a portion of the redistribution layer 140 may serve as feed lines for the antenna elements 190A, and another portion of the redistribution layer 140 may optionally serve as a ground plate for the antenna elements 190A.

In some embodiments, the material of the antenna elements 190A includes aluminum, titanium, copper, nickel, tungsten, and/or alloys thereof. In certain embodiments, the antenna elements 190A are arranged in form of a matrix, such as the N×N array or N×M arrays (N, M>0, N may or may not be equal to M). In some embodiments, the antenna elements 190A may include patch antennas. For example, as shown in FIG. 18, the antenna elements 190A are referred as broadside radiation antennas.

Owing to the configuration of the antenna elements 190A in addition to the antenna elements ATNv and the antenna elements ATNh, a coverage range of the electromagnetic waves in the package structure P2 is further increased, and thus the efficiency of the antenna application of the package structure P2 is further enhanced. For example, in FIG. 18, the package structure P2 may include the antenna elements 190A arranged in form of an array, such as a 2×2 array, however, the disclosure is not limited thereto. The size of the array for the antenna elements 190A can be designated and selected based on the demand.

Figure 19:
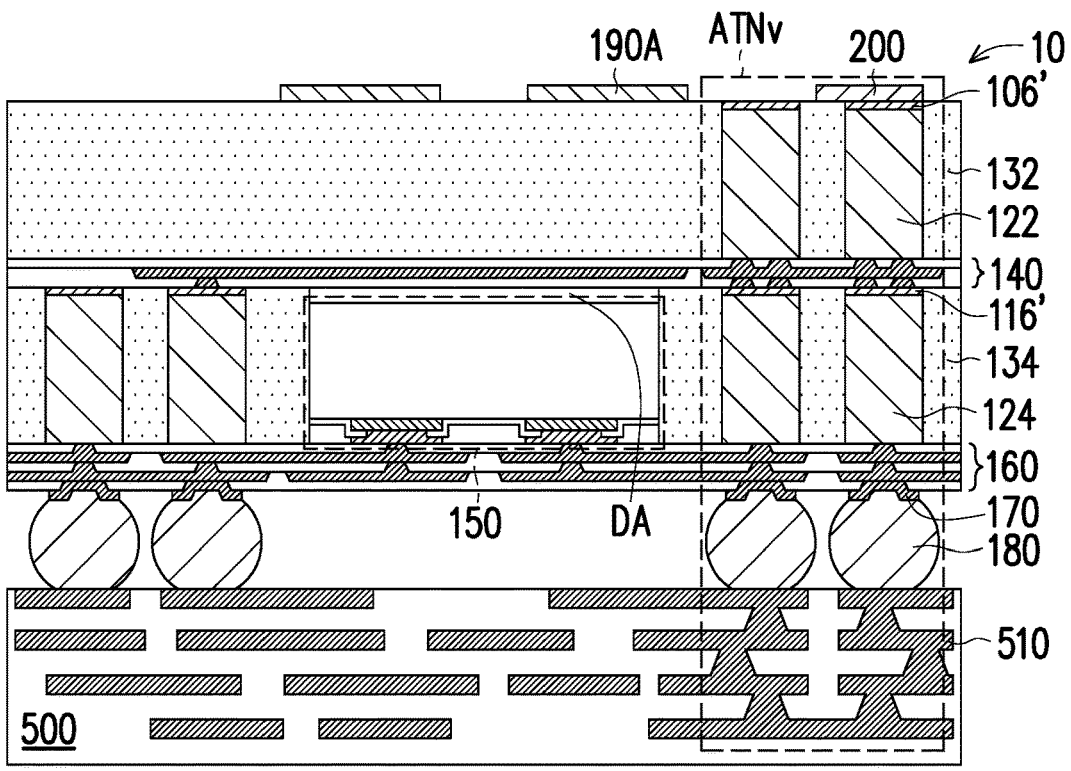
FIG. 19 is a schematic cross sectional view of a package structure according to some exemplary embodiments of the present disclosure.

FIG. 19 is a schematic cross sectional view of a package structure according to some exemplary embodiments of the present disclosure. Referring to FIG. 18 and FIG. 19 together, the package structure P2 depicted in FIG. 18 and the package structure P3 depicted in FIG. 19 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 18 and FIG. 19 together, the difference is that, for the package structure P3 depicted in FIG. 19, the package structure P3 further includes an additional element, e.g. a metal block 200. In some embodiments, the metal block 200 is formed on the insulating encapsulation 132, and is mechanically and electrically connected to the conductive vias 122 having the length L1. As shown in FIG. 19, in some embodiments, the metal block 200 is directly contacted with the conductive vias 122 having the length L1, so that the metal block 200 serves as a part of the antenna elements ATNv. Therefore, the operating frequency of the antenna elements ATNv can be adjusted through the metal block 200. In one embodiment, the metal block 200 and the antenna elements 190A may be formed in the same step. In an alternative embodiment, the metal block 200 and the antenna elements 190A may be formed in the different steps, the disclosure is not limited thereto. The materials of the metal block 200 and the antenna elements 190A may be the same or different.

Figure 20:
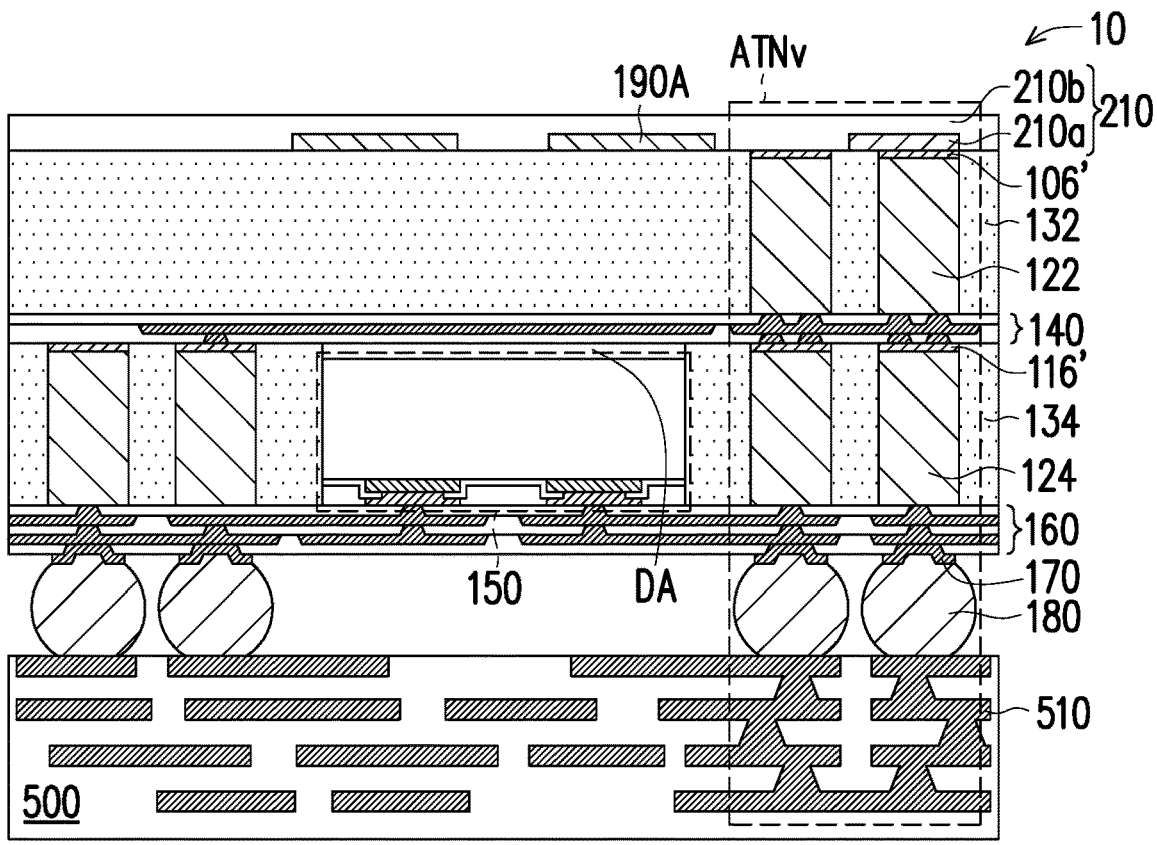
FIG. 20 is a schematic cross sectional view of a package structure according to some exemplary embodiments of the present disclosure.

FIG. 20 is a schematic cross sectional view of a package structure according to some exemplary embodiments of the present disclosure. Referring to FIG. 18 and FIG. 20 together, the package structure P2 depicted in FIG. 18 and the package structure P4 depicted in FIG. 20 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 18 and FIG. 20 together, the difference is that, for the package structure P4 depicted in FIG. 20, the package structure P4 further includes an additional element, e.g. a redistribution layer 210. In some embodiments, the redistribution layer 210 is formed on the insulating encapsulation 132, and is mechanically and electrically connected to the conductive vias 122 having the length L1. As shown in FIG. 20, for example, the formation of the redistribution layer 210 includes sequentially forming one metallization layer 210a and one dielectric layer 210b. As shown in FIG. 20, in some embodiments, the metallization layer 210a is directly contacted with the conductive vias 122 having the length L1, so that the metallization layer 210a serves as a part of the antenna elements ATNv. Therefore, the operating frequency of the antenna elements ATNv can be adjusted through the metallization layer 210a of the redistribution layer 210. In addition, the dielectric layer 210b serves as a protection layer for the metallization layer 210a and the conductive vias 122 of the antenna elements ATNv.

In some embodiments, the material of the dielectric layer 210b includes polyimide, epoxy resin, acrylic resin, phenol resin, benzocyclobutene (BCB), polybenzoxazole (PBO), or any other suitable polymer-based dielectric material, and the dielectric layer 210b may be formed by deposition. In some embodiments, the material of the metallization layer 210a includes aluminum, titanium, copper, nickel, tungsten, and/or alloys thereof, and the metallization layer 210a may be formed by electroplating or deposition. The numbers of the dielectric layer 210b and the metallization layer 210a included in the redistribution layer 210 is not limited according to the disclosure, and is designated and selected based on the demand. In one embodiment, the metallization layer 210a and the antenna elements 190A may be formed in the same step. In an alternative embodiment, the metallization layer 210a and the antenna elements 190A may be formed in the different steps, the disclosure is not limited thereto. The materials of the metallization layer 210a and the antenna elements 190A may be the same or different.

Figure 21:
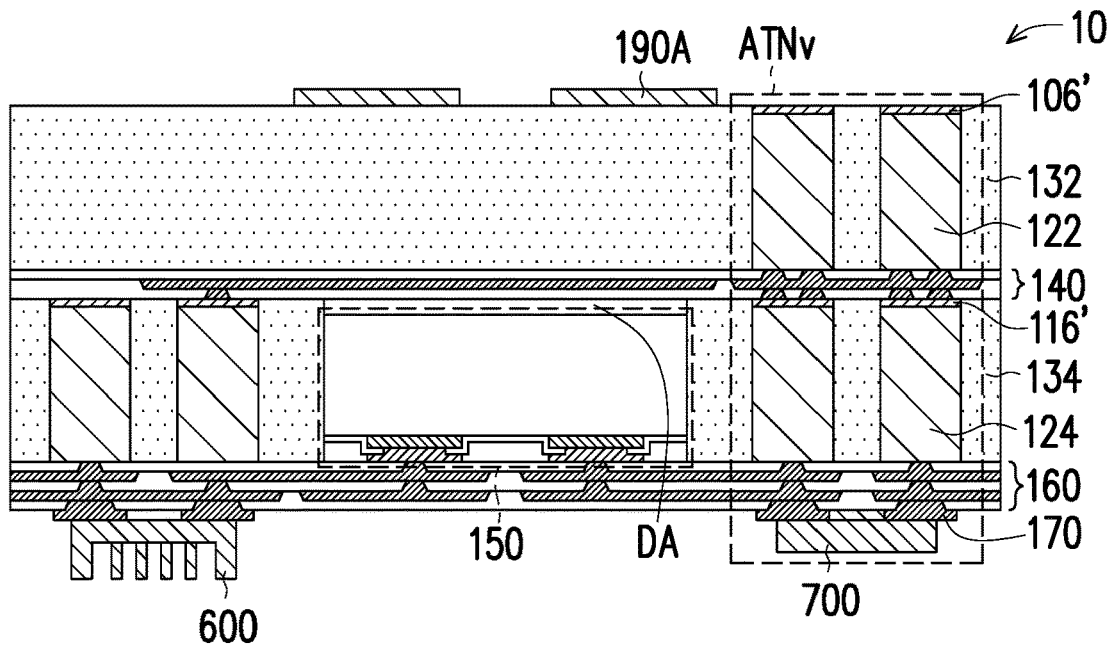
FIG. 21 is a schematic cross sectional view of a package structure according to some exemplary embodiments of the present disclosure.

FIG. 21 is a schematic cross sectional view of a package structure according to some exemplary embodiments of the present disclosure. Referring to FIG. 18 and FIG. 21 together, the package structure P2 depicted in FIG. 18 and the package structure P5 depicted in FIG. 21 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 18 and FIG. 21 together, the difference is that, for the package structure P5 depicted in FIG. 21, the package structure P5 includes a connector 600 and a metal block 700, where the connector 600 and the metal block 700 are in direct contact with the first package 10, and the conductive elements 180 and the second package 500 are omitted from the package structure P5. As shown in FIG. 21, in some embodiments, the metal block 700 is mechanically and electrically connected to the redistribution layer 160, so that the metal block 700 serves as a part of the antenna elements ATNv. Therefore, the operating frequency of the antenna elements ATNv can be adjusted through the metal block 700. In addition, the connector 600 is mechanically and electrically connected to other portion of the redistribution layer 160, so that the first package 10 may be electrically connected to other semiconductor elements through the connector 600.

Figure 22:
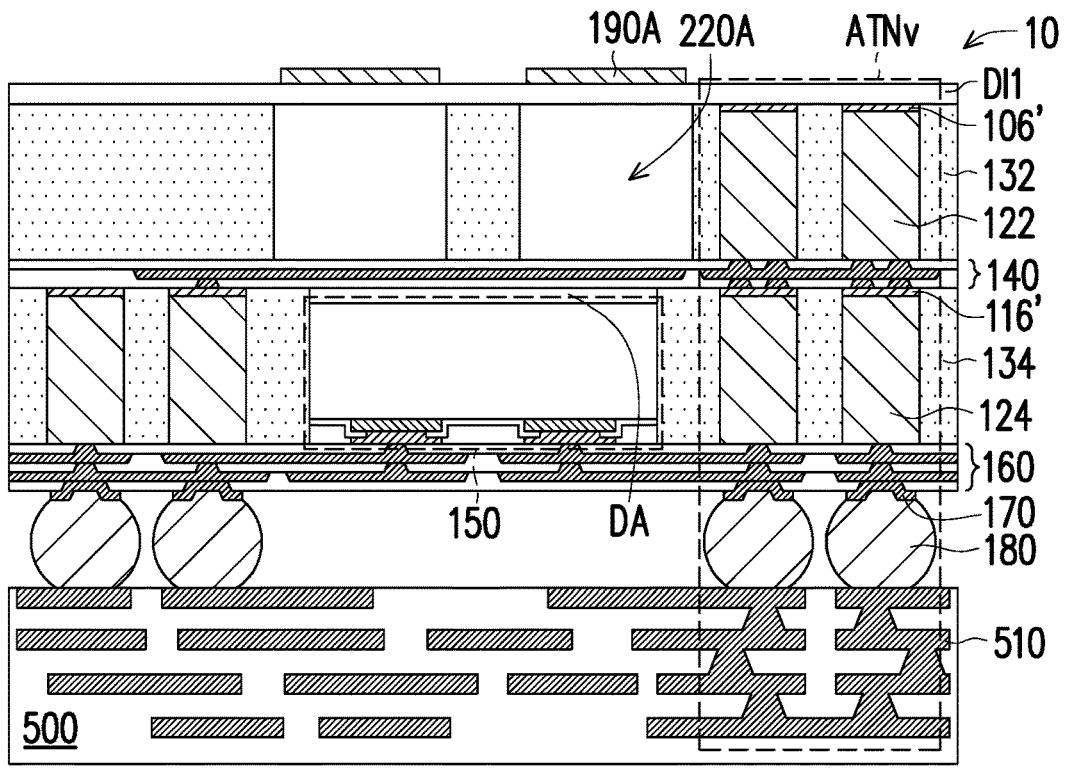
FIG. 22 and FIG. 23 are schematic cross sectional views of a package structure according to some exemplary embodiments of the present disclosure.
Figure 23:
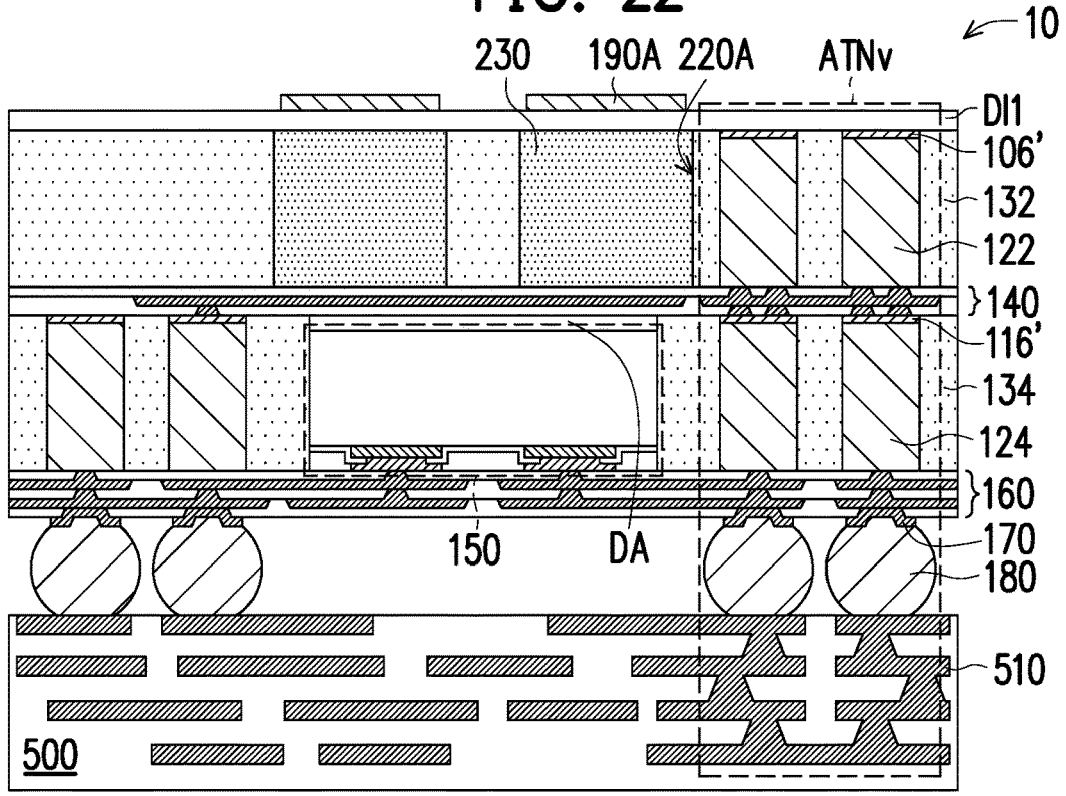

FIG. 22 and FIG. 23 are schematic cross sectional views of a package structure according to some exemplary embodiments of the present disclosure. Referring to FIG. 18, FIG. 22 and FIG. 23 together, the package structure P2 depicted in FIG. 18, the package structure P6 depicted in FIG. 22 and the package structure P7 depicted in FIG. 23 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 18, FIG. 22, and FIG. 23 together, the difference is that, for the package structure P6 depicted in FIG. 22 and the package structure P7 depicted in FIG. 23, each of the package structure P6 and the package structure P7 further includes additional elements, e.g. a dielectric layer DI1 disposed on the insulating encapsulation 132 and at least one cavity 220A formed in the insulating encapsulation 132.

In some embodiments, as shown in FIG. 22 and FIG. 23, the dielectric layer DI1 is formed on the insulating encapsulation 132, and is between the insulating encapsulation 132 and the antenna elements 190A, between the conductive vias 122 an and the antenna elements 190A and between the at least one cavity 220A and the antenna elements 190A. In one embodiment, the dielectric layer DI1 may be made of dielectric materials having low permittivity (Dk) and low loss tangent (Df) properties, or other suitable materials; for example, fused silica. In some embodiments, each of the package structure P6 and the package structure P7 includes cavities 220A, where each of the cavities 220A is immediately underlying (or saying directly below) and overlaps a respective one of the antenna elements 190A. In one embodiment, the cavities 220A are fully filled with air (as shown in FIG. 22), where the air has low permittivity (Dk) and low loss tangent (Df) properties. Due to the air cavities (e.g. the cavities 220A), the package structure P6 achieves a higher gain and wide bandwidth for the antenna elements 190A. In an alternative embodiment, as shown in FIG. 23, the cavities 220A are fully filled with a dielectric material 230 having low permittivity (Dk) and low loss tangent (Df) properties. Due to the cavities 220A and the dielectric material 230 located therein, the package structure P7 achieves a higher gain and wide bandwidth for the antenna elements 190A.

Figure 24:
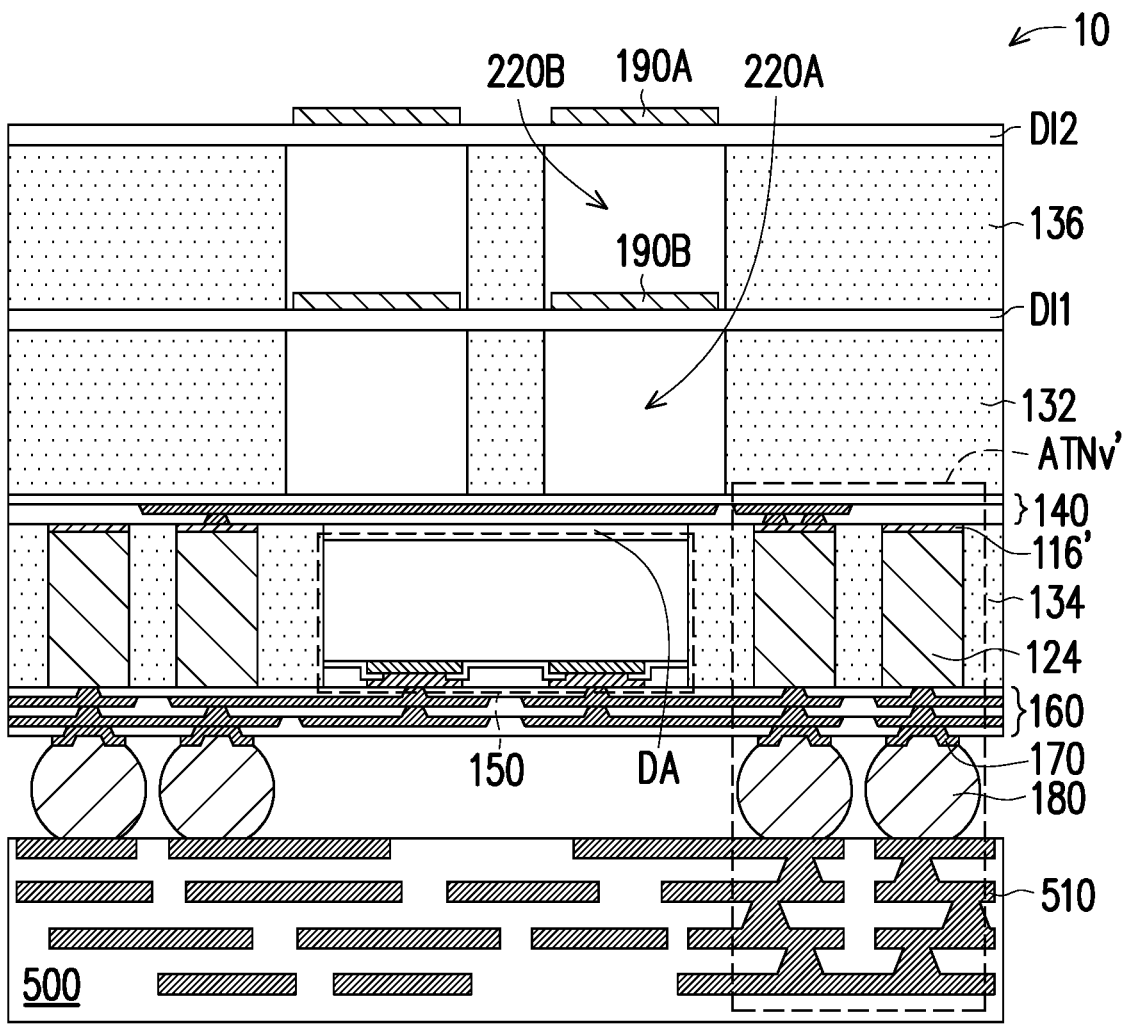
FIG. 24 is a schematic cross sectional view of a package structure according to some exemplary embodiments of the present disclosure.

FIG. 24 is a schematic cross sectional view of a package structure according to some exemplary embodiments of the present disclosure. Referring to FIG. 22 and FIG. 24 together, the package structure P6 depicted in FIG. 22 and the package structure P8 depicted in FIG. 24 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 22 and FIG. 24 together, the difference is that, for the package structure P8 depicted in FIG. 24, the package structure P8 includes the antenna elements ATNv' instead of the antenna elements ATNv, and further includes additional elements, e.g. an insulating encapsulation 136, at least one cavity 220B, a dielectric layer DI2, and antenna element 190B.

In some embodiments, the antenna elements ATNv' is extending from the first package 10 to the second package 500 and electrically connected to the first package 10, and a portion of the antenna element ATNv' is located in the first package 10. In certain embodiments, in FIG. 24, the first package 10 and the second package 500 are electrically connected by directly contacting the conductive elements 180 and the metal segments 510. As shown in FIG. 24, in some embodiments, the antenna elements ATNv' included in the package structure P8 are constituted by a portion of the redistribution layer 140, some of the conductive vias 124 electrically connected to the portion of redistribution layer 140, a portion of the redistribution layer 160 electrically connected to the conductive vias 124, some of the conductive elements 180 electrically connected to the conductive vias 124 through the portion of the redistribution layer 160, and the first portion 510a of the metal segments 510 electrically connected to the above conductive elements 180. In other words, comparing with the antenna elements ATNv of the package structure P6, the antenna elements ATNv' of the package structure P8 have no conductive elements 122 and the corresponding seed layer 106', for example.

As shown in FIG. 24, in some embodiments, the insulating encapsulation 136 is formed over the dielectric layer DI1, and the dielectric layer DI2 is formed on top of the insulating encapsulation 136, where the cavities 220B are formed in the insulating encapsulation 136. In other words, the insulating encapsulation 136 are sandwiched between the dielectric layer DI1 and the dielectric layer DI2. In certain embodiments, the antenna elements 190B are disposed over the insulating encapsulation 132 and on the dielectric layer DI1, and are located within in a respective one of the cavities 220B.

For example, the antenna elements 190B are electrically connected to a part of the redistribution layer 140 in a manner of electrical coupling, and the antenna elements 190A and the antenna element 190B are at least partially overlapped with each other, so that the antenna elements 190A are electrically coupled with the antenna element 190B, where the metallization layer 144 of the redistribution layer 140 overlapped with the antenna elements 190B serves as a ground plate and a feed-line for the antenna elements 190B and the antenna elements 190A. In other words, the antenna elements 190A and the antenna element 190B work together as the broadside radiation antennas, where the antenna elements 190A are referred as upper patch antennas and the antenna element 190B are referred as lower patch antennas. Owing to the configuration of the antenna elements 190A and antenna elements 190B in addition to the antenna elements ATNv' and the antenna elements ATNh, a coverage range of the electromagnetic waves in the package structure P8 is further increased, and thus the gain of the antenna application of the package structure P8 is further enhanced.

Also, Due to the cavities 220B (filled with air), the package structure P8 achieves a higher gain and wide bandwidth for the antenna elements 190A and the antenna elements 190B. In some embodiments, the formation method and material of the antenna elements 190B may be the same as the process and material of the antenna elements 190A, thus may not be repeated herein. In one embodiment, the materials of the antenna elements 190A and the antenna elements 190B are the same, the disclosure is not limited thereto. In an alternative embodiment, the materials of the antenna elements 190A and the antenna elements 190B are different.

Figure 25:
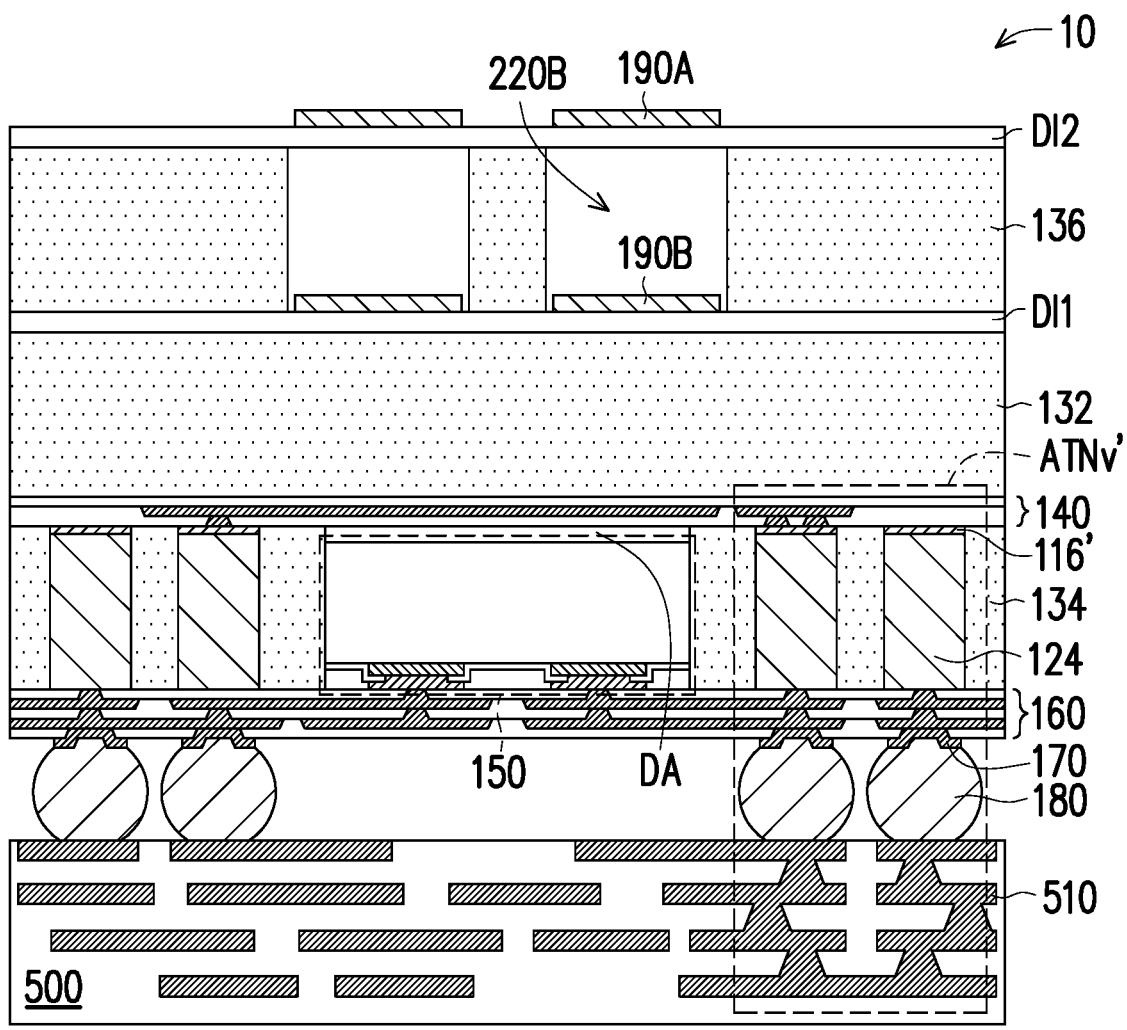
FIG. 25 is a schematic cross sectional view of a package structure according to some exemplary embodiments of the present disclosure.

FIG. 25 is a schematic cross sectional view of a package structure according to some exemplary embodiments of the present disclosure. Referring to FIG. 24 and FIG. 25 together, the package structure P8 depicted in FIG. 24 and the package structure P9 depicted in FIG. 25 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 24 and FIG. 25 together, the difference is that, for the package structure P9 depicted in FIG. 25, the package structure P9 excludes the cavities 220A formed in the insulating encapsulation 132. In some embodiments, the dielectric layer DI1 may be further omitted as well, and the antenna elements 190B may physically contacts the insulating encapsulation 132, the disclosure is not limited thereto.

In some alternative embodiments, the cavities 220A and cavities 220B, if any, may further be filled with dielectric materials having low permittivity (Dk) and low loss tangent (Df) properties, or other suitable materials, the disclosure is not limited thereto. As such, the antenna elements 190B, if any, may be wrapped by the dielectric materials having low permittivity (Dk) and low loss tangent (Df) properties, for example. Due to such configuration, the positioning configuration of the antenna elements 190B can be further secured, thereby ensuring the antenna application provided by the antenna elements 190A and the antenna elements 190B.

According to some embodiments, a package structure includes a sub-package, a conductive structure, and at least one first antenna. The sub-package includes at least one chip. The conductive structure is bonded onto and electrically connected to the sub-package. The at least one first antenna has a vertical polarization and is electrically connected to the at least one chip, wherein the at least one first antenna is partially located in the sub-package, and the at least one first antenna is extended within the sub-package into the conductive structure.

According to some embodiments, a package structure includes a sub-package, a circuit board, and a first antenna. The sub-package has at least one chip and includes first through vias and second through vias electrically connected to the at least one chip. The circuit board has metal segments and is bonded to and electrically connected to the sub-package, wherein each of the second through vias is overlying and electrically connected to a respective one of the first through vias along a stacking direction of the sub-package and the circuit board. The first antenna extends from the sub-package into the circuit board, wherein the first antenna includes a pair of two adjacent second through vias, the respective ones of the first through vias, and a portion of the metal segments electrically connected thereto.

According to some embodiments, a package structure includes a sub-package, at least one metal block, and a first antenna. The sub-package has at least one chip and includes first through vias and second through vias electrically connected to the at least one chip. The at least one metal block is bonded to and electrically connected to the sub-package, wherein each of the second through vias is overlying and electrically connected to a respective one of the first through vias along a stacking direction of the sub-package and the at least one metal block. The first antenna includes a pair of two adjacent second through vias, the respective ones of the first through vias, and the at least one metal block electrically connected thereto, wherein a dimension of the first antenna is greater than a dimension of the at least one chip as measured along a stacking direction of the sub-package and the at least one metal block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a sub-package comprising at least one chip;
   a conductive structure bonded onto and electrically connected to the sub-package; and at least one first antenna having vertical polarization and electrically connected to the at least one chip, wherein the at least one first antenna is partially located in the sub-package, and the at least one first antenna is extended within the sub-package into the conductive structure, wherein in a top view of the package structure along a stacking direction of the sub-package and the conductive structure, the at least one first antenna partially located in the sub-package comprises a first antenna element having a first length and a second antenna element having a second length, and the second length is greater than the first length, wherein in the top view, the first antenna element, the second antenna element and the at least one chip are arranged side-by-side, and a first distance between the second antenna element and the at least one chip is less than a second distance between the first antenna element and the at least one chip.

2. The package structure of claim 1, wherein the at least one first antenna comprises a first portion, a second portion and conductive balls located therebetween, the first portion is embedded in the sub-package, the second portion is embedded in the conductive structure, and the first portion is electrically connected to the second portion through the conductive balls, and wherein the conductive structure comprises a circuit board having metal segments, where a portion of the metal segments is the second portion of the at least one first antenna.

3. The package structure of claim 1, wherein the conductive structure comprises at least one connector and a metal block mechanically and electrically connected to the sub-package respectively, wherein the at least one first antenna comprises a first portion and a second portion, the first portion is embedded in the sub-package, and the second portion is the metal block.

4. The package structure of claim 1, wherein the at least one first antenna comprises a first portion embedded in the sub-package, the first portion has two first vias, wherein the two first vias are located aside of a location of the at least one chip.

5. The package structure of claim 1, wherein the at least one first antenna comprises a first portion embedded in the sub-package, and the first portion has two first vias and two second vias, wherein each of the two second vias is aligned with and electrically connected to a respective one of the two first vias along the stacking direction of the sub-package and the conductive structure.

6. The package structure of claim 1, further comprising second antennas located on the sub-package and electrically coupled to the at least one chip, wherein the sub-package is located between the second antennas and the conductive structure, and the second antennas are patch antennas.

7. The package structure of claim 6, further comprising an encapsulate encapsulant located between the second antennas and the sub-package, wherein a material of the encapsulate encapsulant comprises a dielectric material of low permittivity and low loss tangent.

8. The package structure of claim 1, further comprising third antennas having horizontal polarization and electrically connected to the at least one chip and embedded in the sub-package, wherein a location of the at least one first antenna and locations of the third antennas are located aside of a location of the at least one chip, and wherein the third antennas are located at two opposite sides of the at least one first antenna.

9. A package structure, comprising:
a sub-package having at least one chip, comprising first through vias and second through vias electrically connected to the at least one chip;
a circuit board having metal segments, bonded to and electrically connected to the sub-package, wherein each of the second through vias is overlying and electrically connected to a respective one of the first through vias along a stacking direction of the sub-package and the circuit board; and
a first antenna, extending from the sub-package into the circuit board, wherein the first antenna comprises a pair of two adjacent second through vias, the respective ones of the first through vias and a portion of the metal segments electrically connected thereto,
wherein the first antenna is partially located in the sub-package and comprises a first antenna element having a first length and a second antenna element having a second length in a top view of the package structure along the stacking direction, and the second length is greater than the first length,
wherein in the top view, the first antenna element, the second antenna element and the at least one chip are arranged side-by-side, and a first distance between the second antenna element and the at least one chip is less than a second distance between the first antenna element and the at least one chip.

10. The package structure of claim 9, wherein the sub-package comprises a first redistribution layer and a second redistribution layer electrically connected to the at least one chip, the first through vias and the second through vias, wherein the first redistribution layer is located between the first through vias and the second through vias and between the at least one chip and the second through vias, and the second redistribution layer is located between the first through vias and the circuit board and between the at least one chip and the circuit board.

11. The package structure of claim 10, wherein for the first antenna, in a vertical projection on the first redistribution layer, one of the two adjacent second through vias has a first size measured along a first direction, and other one of the two adjacent second through vias has a second size measured along the first direction, wherein the first size is less than the second size.

12. The package structure of claim 11, wherein a minimum distance between the at least one chip and the second through via having the first size is greater than a minimum distance between the at least one chip and the second through via having the second size.

13. The package structure of claim 11, further comprising a metallic structure located on and electrically connected to the second through via having the first size, wherein the metallic structure is a part of the first antenna.

14. The package structure of claim 9, further comprising second antennas located over a positioning location of the at least one chip and electrically coupled to the at least one chip.

15. The package structure of claim 14, further comprising an insulating encapsulation comprising a first portion and a second portion stacked thereon along the stacking direction of the sub-package and the circuit board, wherein the first portion encapsulates the at least one chip and the first through vias, and the second portion encapsulates the second through vias.

16. The package structure of claim 15, further comprising first air cavities formed within the second portion of the insulating encapsulation, wherein locations of the first air cavities are overlapped with positioning locations of the second antennas, respectively.

17. The package structure of claim 16, further comprising a dielectric material inserting into the first air cavities, wherein a material of the dielectric material is different from a material of the insulating encapsulation.

18. The package structure of claim 17, the material of the dielectric material comprises a dielectric material of low permittivity and low loss tangent.

19. A package structure, comprising:
- a sub-package having at least one chip, comprising first through vias and second through vias electrically connected to the at least one chip;
- at least one metal block, bonded to and electrically connected to the sub-package, wherein each of the second through vias is overlying and electrically connected to a respective one of the first through vias along a stacking direction of the sub-package and the at least one metal block; and
- a first antenna, comprising a pair of two adjacent second through vias, the respective ones of the first through vias and the at least one metal block electrically connected thereto, wherein a dimension of the first antenna is greater than a dimension of the at least one chip as measured along the stacking direction,
- wherein the first antenna is partially located in the sub-package and comprises a first antenna element having a first length and a second antenna element having a second length in a top view of the package structure along the stacking direction, and the second length is greater than the first length,
- wherein in the top view, the first antenna element, the second antenna element and the at least one chip are arranged side-by-side, and a first distance between the second antenna element and the at least one chip is less than a second distance between the first antenna element and the at least one chip.

20. The package structure of claim 19, further comprising at least one connector located on and electrically connected to the sub-package, wherein the at least one chip and the first through vias are located between the at least one connector and the second through vias and between the at least one metal block and the second through vias.

* * * * *